US011968063B2

(12) United States Patent
Han et al.

(10) Patent No.: US 11,968,063 B2
(45) Date of Patent: Apr. 23, 2024

(54) SINGLE-WIRE COMMUNICATION SYSTEM AND CONTROL METHOD THEREOF

(71) Applicant: LEADING UI CO., LTD., Anyang-si (KR)

(72) Inventors: Sang-hyun Han, Anyang-si (KR); Jae-sung An, Anyang-si (KR)

(*) Notice: Subject to any disclaimer, the term of this patent is extended or adjusted under 35 U.S.C. 154(b) by 207 days.

(21) Appl. No.: 17/357,520

(22) Filed: Jun. 24, 2021

(65) Prior Publication Data
US 2022/0417064 A1 Dec. 29, 2022

(51) Int. Cl.
H04L 25/02 (2006.01)
H03K 3/037 (2006.01)

(52) U.S. Cl.
CPC .......... *H04L 25/0282* (2013.01); *H03K 3/037* (2013.01)

(58) Field of Classification Search
CPC ............. H04L 25/0282; H04L 25/0264; H04L 25/028; H04L 25/0292; H04L 25/0294; H03K 3/037; H03K 4/063; H03K 3/027; H03K 3/56; H03K 3/60; H03K 3/66; H03K 3/661; H03K 3/662; H03K 3/663; H03K 3/665; H03K 3/666
See application file for complete search history.

(56) References Cited

U.S. PATENT DOCUMENTS

| 4,038,562 A * | 7/1977 | Kintner | H03K 3/027 327/225 |
| 4,962,341 A * | 10/1990 | Schoeff | H03K 3/037 327/535 |
| 5,594,390 A * | 1/1997 | Holzer | H03H 11/11 331/8 |
| 6,166,570 A * | 12/2000 | Hedberg | H04L 25/0276 330/252 |
| 6,188,314 B1 * | 2/2001 | Wallace | H04L 5/1423 307/38 |

(Continued)

FOREIGN PATENT DOCUMENTS

| KR | 20130072503 A | 7/2013 |
| KR | 20140094674 A | 7/2014 |
| KR | 20180071988 A | 6/2018 |

OTHER PUBLICATIONS

Das et al. ("Voltage mode ASK/BPSK modulator, its extended applications in precision rectifier and data communication using DXCCII"), International Journal of Electronics and Communications, vol. 128, available as of Oct. 2020 (Year: 2020).*

*Primary Examiner* — James M Perez
(74) *Attorney, Agent, or Firm* — LEEPI

(57) ABSTRACT

A single-wire communication system and a control method of the single-wire communication system are disclosed. A single-wire communication system includes a single-wire, a first communication module and a second communication module. The first communication module includes a plurality of current conveyors so as to communicate high-speed signals only with current freely from a capacitive load of the single-wire. The first communication module is connected to one side of the single-wire. The second communication module includes a plurality of current conveyors so as to communicate high-speed signals only with current freely from a capacitive load of the single-wire. The second communication module is connected to another side of the single-wire.

9 Claims, 13 Drawing Sheets

(56) References Cited

U.S. PATENT DOCUMENTS

| | | | | |
|---|---|---|---|---|
| 6,462,852 | B1* | 10/2002 | Paschal | H03K 19/01837 |
| | | | | 326/82 |
| 9,491,008 | B2* | 11/2016 | Dong | H04L 25/03019 |
| 10,298,292 | B2* | 5/2019 | Choi | H05B 47/185 |
| 11,233,500 | B1* | 1/2022 | Kang | G06F 1/10 |
| 2006/0280260 | A1* | 12/2006 | Dally | H04L 25/03878 |
| | | | | 375/296 |
| 2008/0116935 | A1* | 5/2008 | Nair | H04L 25/0282 |
| | | | | 326/83 |
| 2010/0264996 | A1* | 10/2010 | Chang | H03B 27/00 |
| | | | | 331/137 |
| 2011/0019760 | A1* | 1/2011 | Nguyen | H04L 25/0294 |
| | | | | 327/437 |
| 2013/0021294 | A1* | 1/2013 | Maharyta | G06F 3/0446 |
| | | | | 345/174 |
| 2013/0314109 | A1* | 11/2013 | Kremin | H03K 17/9622 |
| | | | | 324/686 |
| 2016/0010990 | A1* | 1/2016 | McGarry | H03M 7/3059 |
| | | | | 348/46 |
| 2016/0322981 | A1* | 11/2016 | Ramanan | H03K 3/08 |
| 2017/0111086 | A1* | 4/2017 | Choi | H04B 3/54 |
| 2017/0208263 | A1* | 7/2017 | McGarry | H04N 25/60 |
| 2017/0343386 | A1* | 11/2017 | Tanaka | G01R 27/2605 |
| 2019/0074820 | A1* | 3/2019 | Namai | H03K 17/165 |
| 2019/0113476 | A1* | 4/2019 | Coln | G01N 27/3278 |
| 2020/0119723 | A1* | 4/2020 | Shin | H03K 19/018521 |
| 2020/0212858 | A1* | 7/2020 | Onishi | H03F 3/3018 |
| 2020/0304105 | A1* | 9/2020 | Osuch | H03H 11/18 |
| 2020/0358565 | A1* | 11/2020 | Rasbornig | H04L 51/23 |
| 2020/0412349 | A1* | 12/2020 | Du | G06F 1/08 |
| 2022/0417064 | A1* | 12/2022 | Han | H04L 25/0282 |

\* cited by examiner

SINGLE-WIRE COMMUNICATION SYSTEM AND CONTROL METHOD THEREOF

BACKGROUND OF THE INVENTION

Technical Field

Exemplary embodiments of the present invention relate to a single-wire communication system and a control method of the single-wire communication system. More particularly, exemplary embodiments of the present invention relate to a single-wire communication system using a current-conveyor and a control method of the single-wire communication system.

Discussion of the Related Art

In order to perform a high-speed communication in a wire, the biggest problem is the capacitance between communication lines. That is, since the signal is transmitted using the voltage change amount of the high-speed line, the capacitance of the line increases the time constant and the capacitive load. Therefore, high-speed data transmission or data communication between long lines (i.e., long-distance data communication) is difficult.

In general, when a signal voltage having a pulse period or phase information is applied, a line capacitance is an element that interferes with communication by generating effects such as distortion and attenuation of a signal, a phase delay, and the like.

Wired high-speed serial communication techniques such as MIPI, LVDS, USB2.0, USB3.0, SATA, etc., which have been known until recently, have increased the speed through high-speed serial signal transmission by reducing an amplitude of the signal voltage to reduce the effect of the capacitive load.

A current value 'i' required for signal transmission may be defined by i=C*(dv/dt). That is, as a frequency component dv/dt (that is, an amount of voltage fluctuation over time) increases, the amount of current 'i' required for signal transmission increases even though a value of C, which is the same capacitive load, is constant. In addition, impedance on the signal line also acts as a resistance, increasing the time constant, thereby interfering with high-speed signal transmission.

SUMMARY

Exemplary embodiments of the present invention provide a single-wire communication system using a current conveyor configured to communicate only with current without little voltage amplitude of a signal freely from a capacitive load (i.e., capacitance, inductance) of a transmission line so that high-speed signals can be transmitted through a long line.

Exemplary embodiments of the present invention also provide a single-wire communication system using a current conveyor capable of reducing the number of pins (or pads) for data transmission between chips to reduce the number of pins, thereby increasing the price competitiveness of chips and reducing power consumption.

Exemplary embodiments of the present invention further also provide a high-speed serial communication system such as MIPI, LVDS, USB2.0, USB3.0, SATA, and DDR signal by implementing multiple channels in parallel using a single-wire communication method using the current conveyor.

Exemplary embodiments of the present invention further also provide a control method of a single-wire communication system using the above-described current conveyor.

According to one aspect of the present invention, a single-wire communication system includes a single-wire, a first communication module and a second communication module. The first communication module includes a plurality of current conveyors so as to communicate high-speed signals only with current freely from a capacitive load of the single-wire. The first communication module is connected to one side of the single-wire. The second communication module includes a plurality of current conveyors so as to communicate high-speed signals only with current freely from a capacitive load of the single-wire. The second communication module is connected to another side of the single-wire.

In an exemplary embodiment, when a first transmitted voltage signal is provided from an external device to the first communication module, the first communication module may convert the first transmitted voltage signal into a first transmitted current signal and outputs it to the second communication module via the single-wire. The second communication module may convert the first transmitted current signal received via the single-wire into a voltage to restore the first transmitted voltage signal.

In an exemplary embodiment, when a second transmitted voltage signal is provided from the outside to the second communication module, the second communication module may convert a second transmitted voltage signal into a second transmitted current signal and outputs it to the first communication module through the single-wire. The first communication module may convert the second transmitted current signal received via the single-wire into a voltage to restore the second transmitted voltage signal.

In an exemplary embodiment, each of the first communication module and the second communication module may be configured in plurality to transmit and receive signals of in-phase or signals of in-phase and in-phase, respectively.

In an exemplary embodiment, a plurality of the first communication modules may be arranged in parallel, and a plurality of the second communication modules may be arranged in parallel. Here, each of the first communication modules and the second communication modules may perform signal transmission through one end and signal reception through the other end at the same time.

In an exemplary embodiment, the first communication module may include a first buffer, a first voltage-current converter, a first current conveyor, a first inverter, a second voltage-current converter, a second current conveyor, a third current conveyor, a first current-voltage conversion amplifier, a first current-voltage conversion amplifier, and a second inverter. The first buffer may be connected to a first input terminal for receiving a first transmitted voltage signal to buffer the first transmitted voltage signal. The first voltage-current converter may have one end connected to the first buffer and another end connected to one end of the single-wire. The first current conveyor may include an X-port connected to another end of the first voltage-current converter, a Y-port to which a common voltage is applied, and a ZP-port. The first current conveyor may mirror a current sensed at the X-port to output the mirrored current through the ZP-port. The first inverter may have one end connected to the first input terminal. The second voltage-current converter may have one end connected to another end of the first inverter. The second current conveyor may include an X-port connected to another end of the second voltage-current converter, a Y-port to which a common voltage is applied, and a ZP-port connected to the ZP-port of the first current conveyor. The third current conveyor may include an X port respectively connected to the ZP-port of the first current conveyor and the ZP-port of the second current conveyor. The third current conveyor may mirror a difference between the currents of the first current conveyor and the second current conveyor to output the mirrored current through a ZP-port. The first current-voltage conversion amplifier may convert the current output through the ZP-port of the third current conveyor into a voltage and amplifying the voltage. The second inverter is connected to an output terminal of the first current-voltage conversion amplifier and a first output terminal.

In an exemplary embodiment, the second communication module may include a second buffer, a third voltage-current converter, a fourth current conveyor, a third inverter, a fourth voltage-current converter, a fifth current conveyor, a fifth current conveyor, a sixth current conveyor, a second current-voltage conversion amplifier, and a fourth inverter. The second buffer may be connected to a second input terminal for receiving a second transmitted voltage signal and buffering the second transmitted voltage signal. The third voltage-current converter may have one end connected to the second buffer and another end connected to one end of the single-wire. The fourth current conveyor may include an X-port connected to another end of the third voltage-current converter, a Y-port to which a common voltage is applied, and a ZP-port. The fourth current conveyor may mirror a current sensed at the X-port to output the mirrored current through the ZP-port. The third inverter may have one end connected to the second input terminal. The fourth voltage-current converter may have one end connected to another end of the third inverter. The fifth current conveyor may include an X-port connected to another end of the fourth voltage-current converter, a Y-port to which a common voltage is applied, and a ZP-port connected to the ZP-port of the fourth current conveyor. The sixth current conveyor may include an X port respectively connected to the ZP-port of the fourth current conveyor and the ZP-port of the fifth current conveyor. The sixth current conveyor may mirror a difference between the currents of the fourth current conveyor and the fifth current conveyor to output the mirrored current through a ZP-port. The second current-voltage conversion amplifier may convert the current output through the ZP-port of the sixth current conveyor into a voltage and amplifying the voltage. The fourth inverter may be connected to an output terminal of the second current-voltage conversion amplifier and a second output terminal.

In an exemplary embodiment, the first communication module may include a first buffer, a first voltage-current converter, a first current conveyor, a first inverter, a second voltage-current converter, a second current conveyor, a first current-voltage conversion amplifier, and a second inverter. The first buffer may be connected to a first input terminal for receiving a first transmitted voltage signal to buffer the first transmitted voltage signal. The first voltage-current converter may have one end connected to the first buffer and another end connected to one end of the single-wire. The first current conveyor may include an X-port connected to another end of the first voltage-current converter, a Y-port to which a common voltage is applied, and a ZP-port. The first current conveyor may mirror a current sensed at the X-port to output the mirrored current through the ZP-port. The first inverter may have one end connected to the first input terminal. The second voltage-current converter may have one end connected to another end of the first inverter. The second current conveyor may include an X-port connected to another end of the second voltage-current converter, a Y-port to which a common voltage is applied, and a ZP-port connected to the ZP-port of the first current conveyor. The third current conveyor may include an X port respectively connected to the ZP-port of the first current conveyor and the ZP-port of the second current conveyor. The third current conveyor may mirror a difference between the currents of the first current conveyor and the second current conveyor to output the mirrored current through a ZP-port. The first current-voltage conversion amplifier may be respectively connected to the ZP-port of the first current conveyor and the ZP-port of the second current conveyor. The first current-voltage conversion amplifier may mirror a difference between the currents of the first current conveyor and the second current conveyor to amplify the mirrored current. The second inverter may be connected to an output terminal of the first current-voltage conversion amplifier and a first output terminal.

In an exemplary embodiment, the second communication module may include a second buffer, a third voltage-current converter, a fourth current conveyor, a third inverter, a fourth voltage-current converter, a fifth current conveyor, a second current-voltage conversion amplifier, and a fourth inverter. The second buffer may be connected to a second input terminal for receiving a second transmitted voltage signal and buffering the second transmitted voltage signal. The third voltage-current converter may have one end connected to the second buffer and another end connected to one end of the single-wire. The fourth current conveyor may include an X-port connected to another end of the third voltage-current converter, a Y-port to which a common voltage is applied, and a ZP-port. The fourth current conveyor may mirror a current sensed at the X-port to output the mirrored current through the ZP-port. The third inverter may have one end connected to the second input terminal. The fourth voltage-current converter may have one end connected to another end of the third inverter. The fifth current conveyor may include an X-port connected to another end of the fourth voltage-current converter, a Y-port to which a common voltage is applied, and a ZP-port connected to the ZP-port of the fourth current conveyor. The second current-voltage conversion amplifier may be respectively connected to the ZP-port of the fourth current conveyor and the ZP-port of the fifth current conveyor. The second current-voltage conversion amplifier may convert a difference between the currents of the fourth current conveyor and the fifth current conveyor into a voltage and amplifying the voltage. The fourth inverter may BE connected to an output terminal of the second current-voltage conversion amplifier and a second output terminal.

In an exemplary embodiment, the first communication module may include a first buffer, a first voltage-current converter, a first current conveyor, a first inverter, a second voltage-current converter, a second current conveyor, a third current conveyor, a first current-voltage conversion resistor, and a second inverter. The first buffer may be connected to a first input terminal for receiving a first transmitted voltage signal to buffer the first transmitted voltage signal. The first voltage-current converter may have one end connected to the first buffer and another end connected to one end of the single-wire. The first current conveyor may include an X-port connected to another end of the first voltage-current converter, a Y-port to which a common voltage is applied, and a ZP-port. The first current conveyor may mirror a current sensed at the X-port to output the mirrored current through the ZP-port. The first inverter may have one end connected to the first input terminal. The second voltage-current converter may have one end connected to another end of the first inverter. The second current conveyor may include an X-port connected to another end of the second voltage-current converter, a Y-port to which a common voltage is applied, and a ZP-port connected to the ZP-port of the first current conveyor. The third current conveyor may include an X port respectively connected to the ZP-port of the first current conveyor and the ZP-port of the second current conveyor. The third current conveyor may mirror a difference between the currents of the first current conveyor and the second current conveyor to output the mirrored current through a ZP-port. The first current-voltage conversion resistor may receive a current output through the ZP port of the third current conveyor through one end and converting the current into a voltage. The second inverter may be connected to another end of the first current-voltage conversion resistor and a first output terminal.

In an exemplary embodiment, the second communication module may include a second buffer, a third voltage-current converter, a fourth current conveyor, a third inverter, a fourth voltage-current converter, a fifth current conveyor, a sixth current conveyor, a second current-voltage conversion resistor, and a fourth inverter. The second buffer may be connected to a second input terminal for receiving a second transmitted voltage signal and buffering the second transmitted voltage signal. The third voltage-current converter may have one end connected to the second buffer and another end connected to one end of the single-wire. The fourth current conveyor may include an X-port connected to another end of the third voltage-current converter, a Y-port to which a common voltage is applied, and a ZP-port, the fourth current conveyor mirroring a current sensed at the X-port to output the mirrored current through the ZP-port. The third inverter may have one end connected to the second input terminal. The fourth voltage-current converter may have one end connected to another end of the third inverter. The fifth current conveyor may include an X-port connected to another end of the fourth voltage-current converter, a Y-port to which a common voltage is applied, and a ZP-port connected to the ZP-port of the fourth current conveyor. The sixth current conveyor may include an X port respectively connected to the ZP-port of the fourth current conveyor and the ZP-port of the fifth current conveyor. The sixth current conveyor may mirror a difference between the currents of the fourth current conveyor and the fifth current conveyor to output the mirrored current through a ZP-port. The second current-voltage conversion resistor may receive a current output through the ZP-port of the sixth current conveyor through one end and converting the current into a voltage. The fourth inverter may be connected to another end of the second current-voltage conversion resistor and a second output terminal.

According to another aspect of the present invention, a single-wire communication system includes a single-wire, a first communication module, and a second communication module. The first communication module includes a first buffer for receiving a transmitted voltage signal through one end, a voltage-current converter connected to another end of the first buffer through one end, and a first current conveyor connected to the voltage-current converter through one end. The first communication module converts the transmitted voltage signal into a transmitted current signal and outputs the transmitted current signal to the single-wire. The second communication module includes a second current conveyor connected to the single-wire through one end to receive the transmitted current signal, and a current-voltage converter and an inverter commonly connected to another end of the second current conveyor. The second communication module converts the transmitted current signal received via the single-wire into a voltage and restores the transmitted voltage signal.

In an exemplary embodiment, the first current conveyor may include an X-port connected to another end of the voltage-current converter, a Y-port to which a common voltage is applied, and a ZP-port connected to the single-wire. The first current conveyor may mirror the current sensed in the X-port to output the mirrored current to the single-wire through the ZP-port.

In an exemplary embodiment, the second current conveyor may include an X-port connected to the single-wire, a Y-port to which a common voltage is applied, and a ZP-port commonly connected to the current-voltage converter and the inverter. The second current conveyor may mirror a current sensed in the X-port to output the mirrored current through the ZP-port.

In an exemplary embodiment, the voltage-current converter may include a first resistor, and the current-voltage converter may include a second resistor. Here, a resistance value of the second resistor may be 0.5 to 4 times a resistance value of the first resistor.

In an exemplary embodiment, the single-wire communication system may further include a capacitor connected in parallel with the current-voltage converter.

In an exemplary embodiment, the inverter may include a Schmitt trigger inverter.

In an exemplary embodiment, each of the first current conveyor and the second current conveyor may be activated in response to an enable signal and may be deactivated in response to a disable signal.

According to another aspect of the present invention, there is provided a control method of a single-wire communication system. In the method, a transmitted voltage signal is buffered, which is received from an external device. Then, the buffered transmitted voltage signal is converted into a transmitted current signal. Then, the transmitted current signal is mirrored and the mirrored transmitted current signal is outputted to a single-wire. Then, the transmitted current signal received via the single-wire is mirrored and a mirrored transmitted current signal is outputted. Then, the mirrored transmitted current signal is converted into a voltage. Then, a phase of the signal converted to the voltage is inverted to restore the transmitted voltage signal.

According to some exemplary embodiments of the present invention, it is configured to communicate only with current without little voltage amplitude of a signal freely from a capacitive load (i.e., capacitance, inductance) of a transmission line, so that high-speed signals may be transmitted through a long line. Moreover, the number of pins (or pads) for data transmission between chips is reduced to one, to reduce the number of pins, thereby increasing the price competitiveness of the chip and reducing power consumption.

BRIEF DESCRIPTION OF THE DRAWINGS

The above and other features and aspects of the present invention will become more apparent by describing in detailed exemplary embodiments thereof with reference to the accompanying drawings, in which.

DETAILED DESCRIPTION OF THE INVENTION

Figure 1:
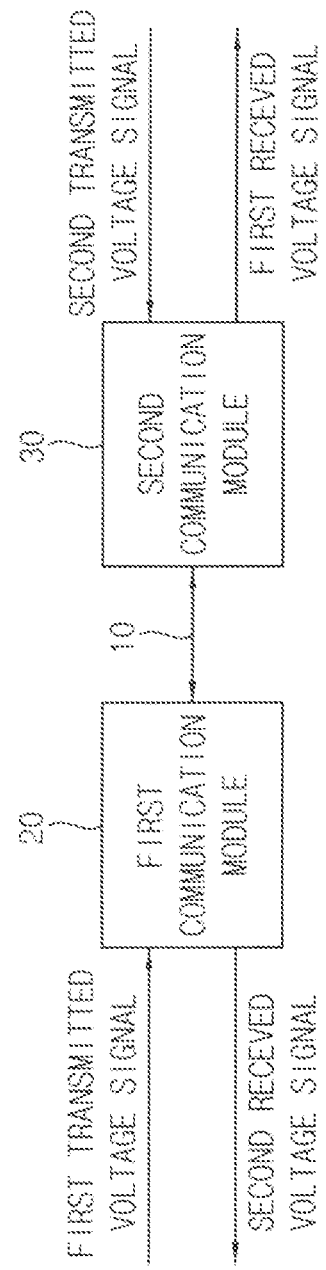
FIG. 1 is a block diagram illustrating a single-wire communication system according to an embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a block diagram illustrating a single-wire communication system according to an embodiment of the present invention. In particular, a single-wire communication system using a current conveyor is shown.

Referring to FIG. 1, a single-wire communication system according to an embodiment of the present invention includes a single-wire 10, a first communication module 20 connected to one side of the single-wire 10, and a second communication module 30 connected to another side of the single-wire 10.

The first communication module 20 includes a plurality of current conveyors, and is connected to one side of the single-wire 10. The first communication module 20 provides a first transmitted voltage signal provided from an external device (not shown) to the second communication module 30 via the single-wire 10. The first communication module 20 restores a second transmitted voltage signal provided from the second communication module 30 via the single-wire 10 to a second received voltage signal. The first transmitted voltage signal may include data information and clock information.

The second communication module 30 includes a plurality of current conveyors, and is connected to another side of the single-wire 10. The second communication module 30 provides a second transmitted voltage signal provided from an external device (not shown) to the first communication module 20 via the single-wire 10. The second communication module 30 restored a first transmitted voltage signal provided from the first communication module 20 via the single-wire 10 to a first received voltage signal. The second transmitted voltage signal may include data information and clock information.

In the present embodiment, when the first communication module 20 operates as a master device, the second communication module 30 operates as a slave device. When the second communication module 30 operates as a master device, the first communication module 20 operates as a slave device. Here, the master device may mean a controller circuit or a processor capable of controlling the slave device. For example, the master device is implemented as a baseband modem processor chip, a chip capable of performing functions of a modem and an application processor (AP) together, an AP, or a mobile AP, but it is not limited thereto.

The slave device includes a radio frequency integrated circuit (RFIC), a connectivity chip, a sensor, a fingerprint recognition chip, a power management IC, and a power supply module, a digital display interface chip, a memory (DRAM, SRAM, FLASH) chip, a display driver IC, or a touch screen controller, but is not limited thereto.

In the present embodiment, the current conveyor may be a second generation current conveyor (CCII). In general, the second generation current conveyor (CCII) is known as a basic component of current-mode signal processing. In the second generation current conveyor, a X-port, which follows the voltage of the Y-port, functions as a voltage follower, and a ZP-port, which conveys the current flowing in and out of the X terminal, functions as a current follower.

Therefore, as a basic configuration circuit for current-mode signal processing, studies on the second-generation current conveyor itself and its application circuit are actively being conducted. In an ideal second-generation current conveyor, Y-port (or voltage input terminal) to which voltage is input has an infinite input impedance, X-port (or current input terminal) to which current is input has a zero input impedance, and ZP-port (or current output terminal) from which current is output has an infinite output impedance.

When a first transmitted voltage signal is provided to the first communication module 20 from the outside, the first communication module 20 converts the first transmitted voltage signal into a first transmitted current signal and outputs it to the second communication module 30 through the single-wire 10. In addition, the second communication module 30 converts the first transmitted current signal received via the single-wire 10 into a voltage to restore the first transmitted current signal as the first transmitted voltage signal.

When a second transmitted voltage signal is provided to the second communication module 30 from the outside, the second communication module 30 converts the second transmitted voltage signal into a second transmitted current signal and outputs it to the first communication module 20 through the single-wire 10. In addition, the first communication module 20 converts the second transmitted current signal received via the single-wire 10 into a voltage to restore the second transmitted current signal as the second transmitted voltage signal.

Each of the first communication module 20 and the second communication module 30 may simultaneously perform a transmission operation and a reception operation.

For example, after arranging a plurality of first communication modules 20 in parallel, and arranging a plurality of second communication modules 30 in parallel, each of the first communication modules 20 may transmit in-phase signals or in-phase and inverse signals of signals to be transmitted, and each of the second communication modules 30 may receive in-phase signals or in-phase and reverse signals.

Meanwhile, after arranging a plurality of first communication modules 20 in parallel, and arranging a plurality of second communication modules 30 in parallel, each of the second communication modules 30 may transmit in-phase signals or in-phase and inverse signals of signals to be transmitted, and each of the first communication modules 20 may receive in-phase signals or in-phase and inverse signals.

Meanwhile, after arranging a plurality of first communication modules 20 in parallel, and arranging a plurality of second communication modules 30 in parallel, each of the first communication modules 20 and the second communication modules 30 may simultaneously perform signal transmission through one end and signal reception through another end.

Meanwhile, the second communication module 30 performs only a reception operation when the first communication module 20 performs a transmission operation, and the first communication module 20 may only perform a reception operation when the second communication module 30 performs a transmission operation.

The single-wire communication system according to the present invention performs an interface operation of data information and clock information through the single-wire. Accordingly, each of the first communication module 20 and the second communication module 30 of the single-wire communication system requires only one pin to transmit and receive data information and clock information. This means that the number of pins for implementing the single-wire communication system is reduced, thereby reducing the overall area required to implement the integrated circuit (IC).

In more detail, according to a general inter-integrated circuit (I2C) interface method, a master device and a slave device each require at least two pins in order to transmit and receive a clock signal and a data signal. That is, each of the master device and the slave device requires not only a pin for transmitting and receiving a data signal, but also a pin for transmitting and receiving a clock signal.

In contrast, since the first communication module 20 and the second communication module 30 of the single-wire communication system of FIG. 1 only require one wire, an area for implementing the integrated circuit may be reduced compared to the general inter-integrated circuit (I2C) interface method.

Meanwhile, by implementing multiple channels in parallel with the single-wire communication device using the current conveyor, a high-speed serial communication system such as MIPI, LVDS, USB2.0, USB3.0, SATA, and DDR signals may be provided. The high-speed serial communication may be implemented in a form in which a conventional transmission signal to be transmitted is used alone. Alternatively, the high-speed serial communication may be implemented in a form of a differential signal that transmits a conventional signal and a reverse-phase signal of the conventional signal together. Since it communicates with only current with almost no voltage amplitude of the signal, it is advantageous to transmit a high-speed signal on a long line because it is free from the capacitive load (i.e., capacitance and inductance) of the transmission line.

Figure 2A:
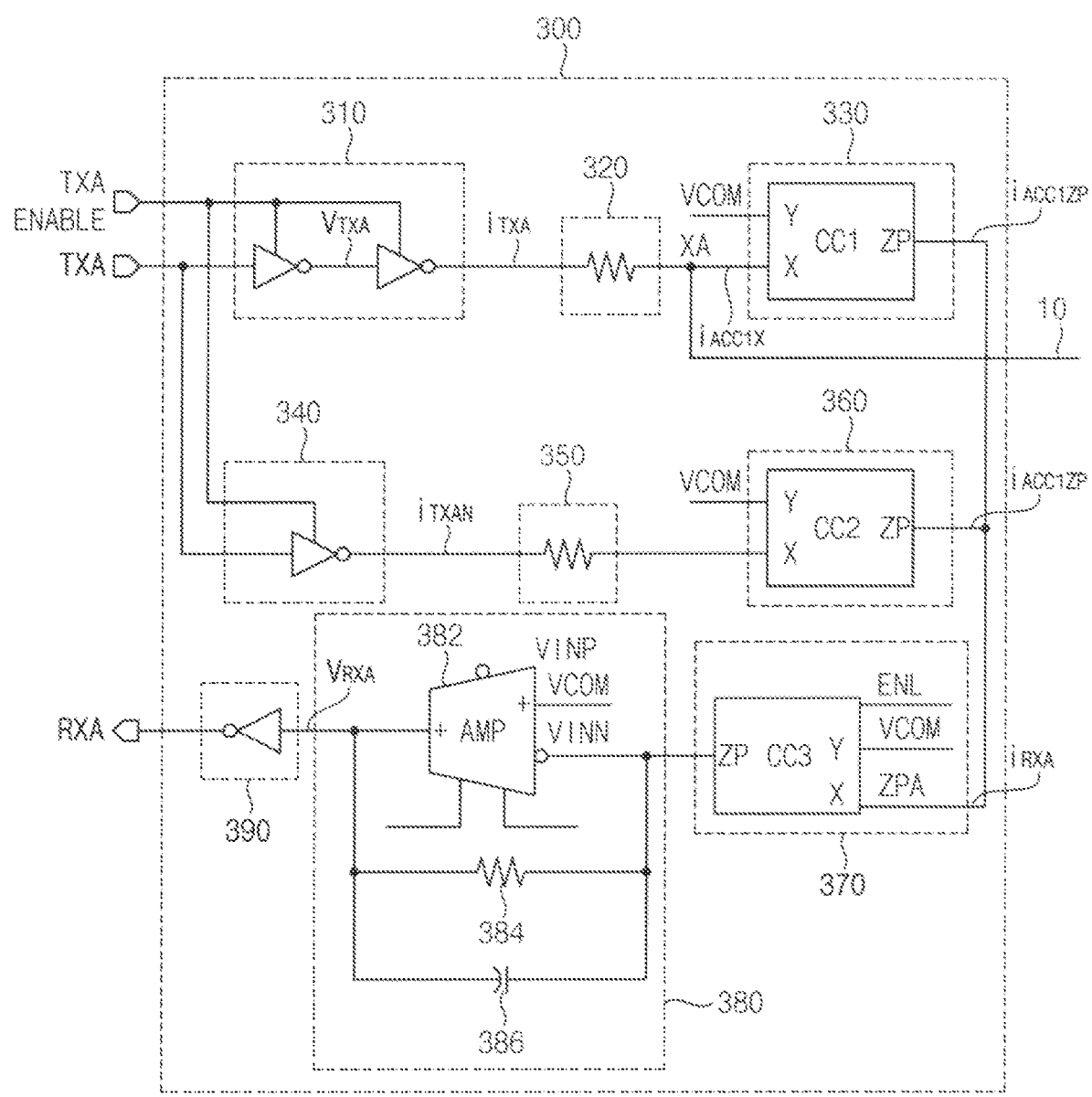
FIG. 2A and FIG. 2B are circuit diagrams explaining an example of a single-wire communication system shown in FIG. 1.
Figure 2B:
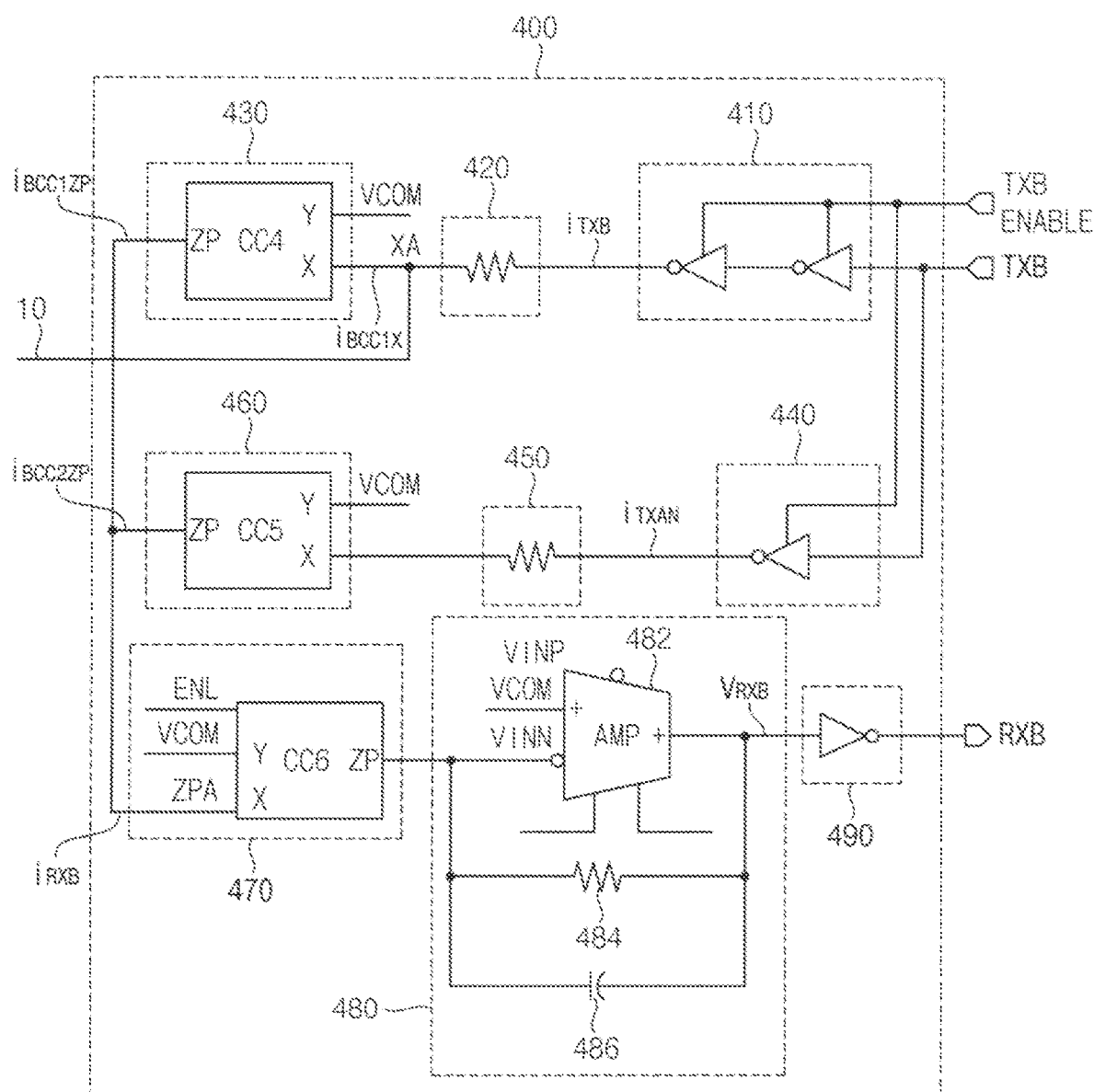
Figure 3:
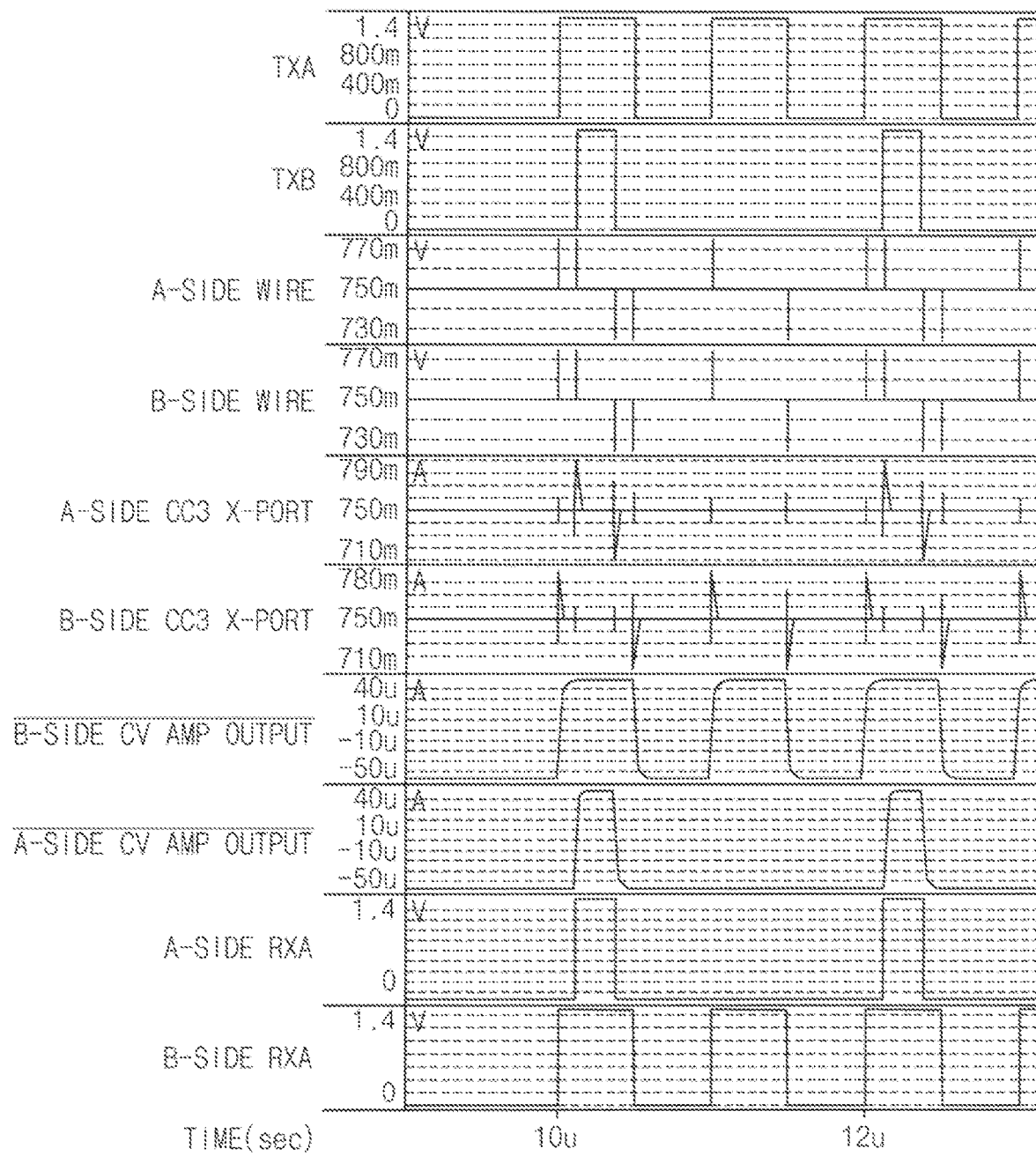
FIG. 3 is a voltage waveform diagram explaining an operation of the single-wire communication system shown in FIG. 2A and FIG. 2B.

FIG. 2A and FIG. 2B are circuit diagrams explaining an example of a single-wire communication system shown in FIG. 1. FIG. 3 is a voltage waveform diagram explaining an operation of the single-wire communication system shown in FIG. 2A and FIG. 2B. In the present embodiment, one side of the single-wire, that is, a left area is defined as a A-side, and another side of the single-wire, that is, a right area is defined as a B-side.

Referring to FIG. 1, FIG. 2A, FIG. 2B and FIG. 3, a first communication module 300 includes a first buffer 310, a first voltage-current converting part 320, a first current conveyor (hereinafter, CC1) 330, a first inverter 340, a second voltage-current converting part 350, a second current conveyor (hereinafter, CC2) 360, a third current conveyor (hereinafter, CC3) 370, a first current-voltage switching amplifier 380 and a second inverter 390.

The first buffer 310 is connected to a first input terminal TXA for receiving a first transmitted voltage signal from an external device (not shown). The first buffer 310 buffers the first transmitted voltage signal and then provides the buffered first transmitted voltage signal to the first voltage-current converting part 320. In the present embodiment, the first buffer 310 includes a front inverter and a rear inverter connected in series. In the present embodiment, the first buffer 310 applies a TXA value to the first voltage-current converting part 320 when a TXA enable pin is activated, and floats when the TXA enable pin is activated. In the present embodiment, reference numeral TXA is used interchangeably with the first input terminal and the first transmitted voltage signal. In the present embodiment, since an output current of the first buffer 310 is low, the first buffer 310 may be used for sufficient amplitude.

The first voltage-current converting part 320 includes a first resistor. The first resistor has a first end connected to the first buffer 310 and a second end connected to a first end of the single-wire 10 and the first current conveyor 330. The first resistor converts the buffered first transmitted voltage signal into current to provide the converted current to a first end of the single-wire 10 and the first current conveyor 330. That is, the first voltage-current converting part 320 performs the role of converting a voltage into a current.

The first current conveyor 330 includes an X-port connected to a second end of the first voltage-current converting part 320, a Y-port and a ZP-port to which a common voltage VCOM is applied. The first current conveyor 330 may mirror the current sensed through the X-port and outputs the mirrored current through the ZP-port.

A first end of the first inverter 340 is connected to a first input terminal TXA to invert a polarity of the first transmitted voltage signal. In the present embodiment, the first inverter 340 applies the inverted TXA value to the second voltage-current converting part 350 when the TXA enable pin is active, and floats when the inverted TXA enable pin is activated.

The second voltage-current converting part 350 includes a second resistor. The second resistor has a first end connected to a second end of the first inverter 340. The second resistor converts the first transmitted voltage signal having an inverted polarity into a current to provide the current to the second current conveyor 360.

The second current conveyor 360 includes an X-port connected to a second end of the second voltage-current converting part 350, a Y-port to which a common voltage is applied, and a ZP-port connected to the ZP-port of the first current conveyor 330. The second current conveyor 360 may mirror the current sensed in the X-port to outputs the mirrored current through the ZP-port.

The third current conveyor 370 has an X-port connected to a ZP-port of the first current conveyor 330 and a ZP-port of the second current conveyor 360, respectively, so that the third current conveyor 370 mirrors the difference value of the current between the first current conveyor 330 and the second current conveyor 360, and outputs the mirrored current through the ZP-port.

The first current-voltage conversion amplifier 380 includes a first OP-AMP 382 and a first amplifier resistor 384. The first current-voltage conversion amplifier 380 converts a current output through the ZP-port of the third current conveyor 370 into a voltage and amplifies the converted voltage.

The first OP-AMP 382 has a positive terminal to which a common voltage is applied and a negative terminal receiving a current value output through the ZP-port of the third current conveyor 370. The first amplifier resistor 384 is connected between the negative terminal and the output terminal of the first OP-AMP 382.

The first current-voltage conversion amplifier 380 may further include a first amplifier capacitor 386 for removing harmonic noise. In the present embodiment, the first amplifier capacitor 386 may be used to remove line noise and increase the phase margin of the amplifier.

The second inverter 390 is connected to an output terminal of the first current-voltage conversion amplifier 380 and a first output terminal RXA. In the present embodiment, reference numeral RXA is used interchangeably with the first output terminal and the second received voltage signal.

On the other hand, the second communication module 400 includes a second buffer 410, a third voltage-current converting part 420, a fourth current conveyor (hereinafter, CC4) 430, a third inverter 440, a fourth voltage-current converting part 450, a fifth current conveyor (hereinafter, CC5) 460, a sixth current conveyor (hereinafter, CC6) 470, a second current-voltage conversion amplifier 480, and a fourth inverter 490.

The second buffer 410 is connected to a second input terminal TXB for receiving a second transmitted voltage signal from an external device (not shown). The second buffer 410 buffers the second transmitted voltage signal and provides the buffered second transmitted voltage signal to the third voltage-current converting part 420. In the present embodiment, the second buffer 410 includes a front inverter and a rear inverter connected in series. In the present embodiment, the second buffer 410 applies a TXB value to the third voltage-current converting part 420 when the TXB enable pin is activated, and floats when the TXB enable pin is activated. In the present embodiment, reference numeral TXB is used interchangeably with the second input terminal and the second transmitted voltage signal. In the present embodiment, the second buffer 410 has a low output current and thus can be used for sufficient amplitude.

The third voltage-current converting part 420 includes a third resistor. The third resistor has one end connected to the second buffer 410 and another end connected to another end of the single-wire 10 and the fourth current conveyor 430. The third resistor converts the buffered second transmitted voltage signal into current and provides it to another end of the single-wire 10 and the fourth current conveyor 430. That is, the third voltage-current converting part 420 performs the role of converting a voltage into a current.

The fourth current conveyor 430 includes an X-port connected to the second end of the third voltage-current converting part 420, and a Y-port and a ZP-port to which a common voltage VCOM is applied. The fourth current conveyor 430 may mirror the current sensed in the X-port and outputs the mirrored current through the ZP-port.

The third inverter 440 is connected to the second input terminal TXB through a first end to invert a polarity of the second transmitted voltage signal. In the present embodiment, the third inverter 440 applies an inverted TXB value to the fourth voltage-current converting part 450 when the TXB enable pin is activated, and floats when the inverted TXB enable pin is activated.

The fourth voltage-current converting part 450 includes a fourth resistor. A first end of the fourth resistor is connected to a second end of the third inverter 440. The fourth resistor converts a second transmitted voltage signal whose polarity is inverted into a current and provides the converted current to the fifth current conveyor 460.

The fifth current conveyor 460 includes an X-port connected to a second end of the fourth voltage-current converting part 450, an Y-port to which a common voltage is applied, and a ZP-port connected to ZP-port of the fourth current conveyor 430. The fifth current conveyor 460 may mirror a current sensed in the X-port and outputs the mirrored current through the ZP-port.

In the sixth current conveyor 470, an X-port is connected to a ZP-port of the fourth current conveyor 430 and a ZP-port of the fifth current conveyor 460, respectively. The sixth current conveyor 470 may mirror the difference value of the current between the fourth current conveyor 430 and the fifth current conveyor 460 and outputs the mirrored current through the ZP-port.

The second current-voltage conversion amplifier 480 includes a second OP-AMP 482 and a second amplifier resistor 484. The second current-voltage conversion amplifier 480 converts the current output through the ZP-port of the sixth current conveyor 470 into a voltage and amplifies the converted voltage.

The second OP-AMP 482 has a positive terminal to which a common voltage is applied and a negative terminal receiving a current value output through the ZP-port of the third current conveyor 370. The second amplifier resistor 484 is connected between the negative terminal and the output terminal of the first OP-AMP 482.

The second current-voltage conversion amplifier 380 may further include a second amplifier capacitor 486 for removing harmonic noise. In the present embodiment, the second amplifier capacitor 486 may be used to remove line noise and increase the phase margin of the amplifier.

The fourth inverter 490 is connected to an output terminal of the second current-voltage conversion amplifier 480 and a second output terminal RXB. In the present embodiment, reference numeral RXB is used interchangeably with the second output terminal and the first received voltage signal.

The present invention makes it possible to perform high-speed long-line communication by making almost no voltage change on a wired communication line even during communication, and enables unidirectional or simultaneous bidirectional communication through a single line.

Typically, in the structure of the current conveyor, when the voltage at the Y-port is set to a common voltage VCOM, the voltage at the X-port also maintains the common voltage level. In this case, when there is a current signal flowing into the X-port, the voltage of the X-port continuously maintains a common voltage VCOM according to the characteristics of the current conveyor, and the ZP-port has characteristics outputting by mirroring the current flowing into the X-port.

Therefore, as shown in the voltage waveform diagram of FIG. 3, even though TXA and TXB communicate in both directions at the same time, the voltage of the A-side wire and the B-side wire is maintained at a common voltage VCOM of 0.75V. Although a peak voltage of about ±20 mV occurs instantaneously, it is a kind of ripple voltage generated to operate the current conveyor, and it is reasonable to assume that there is little change in voltage due to the very short amplitude and holding time of the voltage.

Meanwhile, in FIG. 2A, it has been described that each of the first voltage-current converting part 320 and the second voltage-current converting part 350 is composed of a resistor, but they may be implemented as an analog switch, a current source, or the like.

Figure 4:
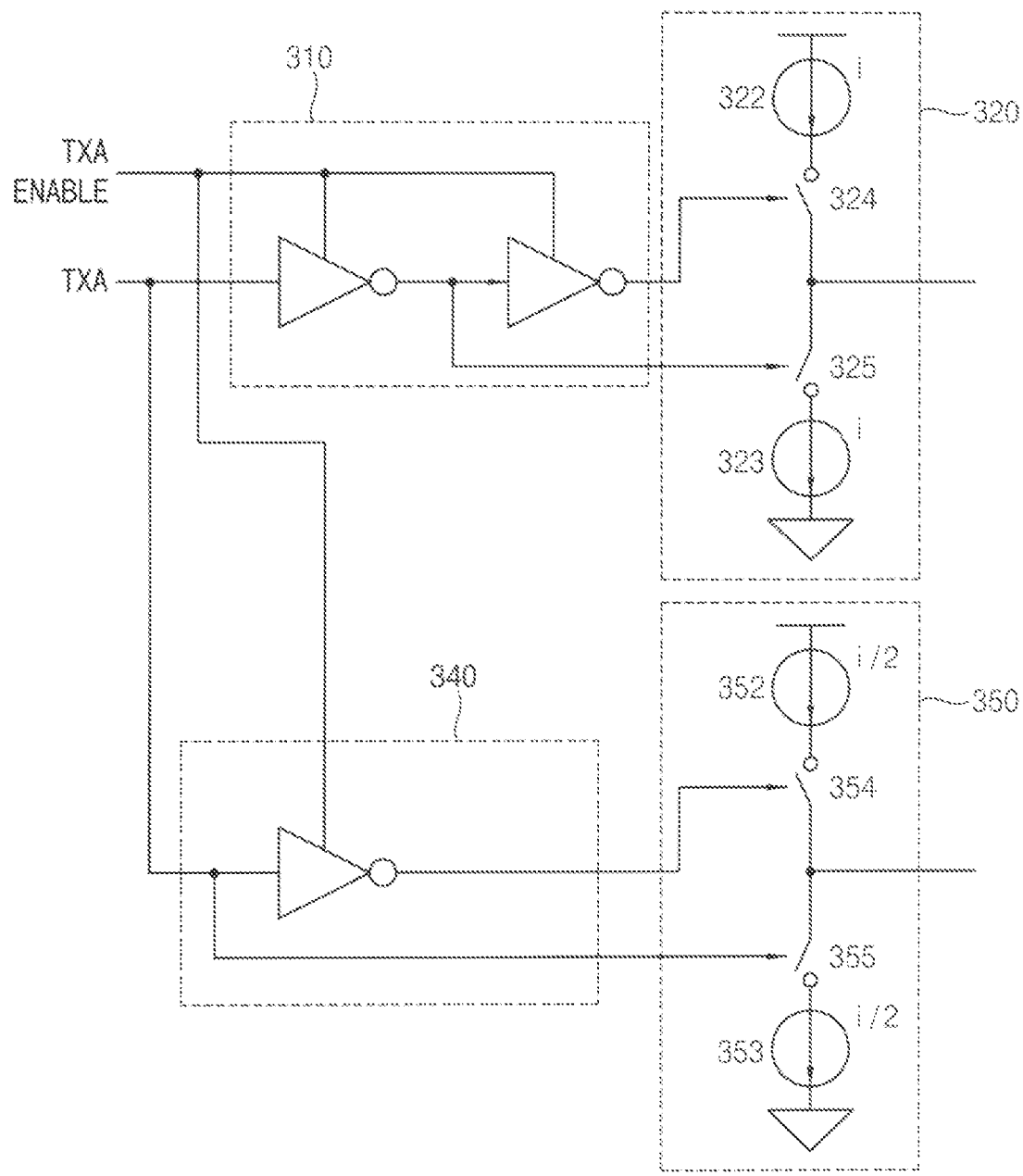
FIG. 4 is another circuit diagram realizing the first voltage-current converting part and the second voltage-current converting part shown in FIG. 2A.

FIG. 4 is another circuit diagram realizing the first voltage-current converting part 320 and the second voltage-current converting part 350 shown in FIG. 2A.

Referring to FIG. 4, a first voltage-current converting part 320 includes a first pull-up current source 322, a first pull-down current source 323, a first pull-up switch 324 and a second pull-down switch 325.

The first pull-up current source 322 and the first pull-down current source 323 generate a first current. The first pull-up switch 324 controls the output of the first current generated by the first pull-up current source 322 in response to a signal output from the rear-stage inverter of the first buffer 310. The second pull-down switch 325 controls the output of the first current generated by the first pull-down current source 323 in response to a signal output from the front-end inverter of the first buffer 310.

Accordingly, a current corresponding to the first transmitted voltage signal, that is, a first current is applied to the X-port of the first current conveyor (CC1) 330.

The second voltage-current converting part 350 includes a second pull-up current source 352, a second pull-down current source 353, a second pull-up switch 354, and a second pull-down switch 355.

The second pull-up current source 352 and the second pull-down current source 353 generate a second current. In the present embodiment, the second current is ½ of the first current. The second pull-up switch 354 controls the output of the second current generated by the second pull-up current source 352 in response to a signal output from the first inverter 340. The second pull-down switch 355 controls the output of the second current generated by the second pull-down current source 353 in response to a signal applied to the first inverter 340.

Accordingly, a current corresponding to the inversion signal of the first transmitted voltage signal, that is, a second current is applied to the X-port of the second current conveyor (CC2) 360.

Meanwhile, in FIG. 2B, it has been described that each of the third voltage-current converting part 420 and the fourth voltage-current converting part 450 is composed of a resistor, but they may be implemented as an analog switch, a current source, or the like.

Figure 5:
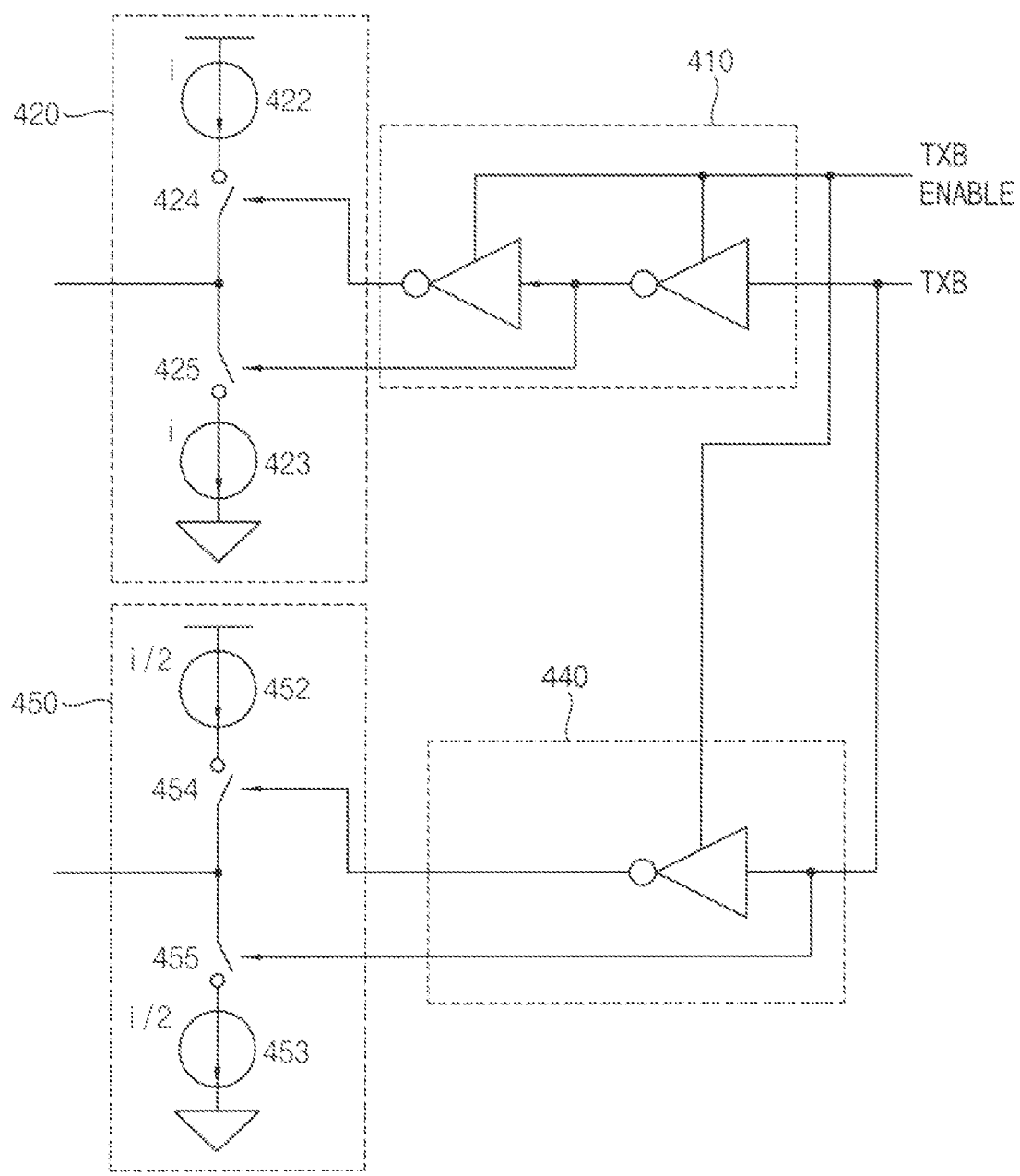
FIG. 5 is another circuit diagram realizing the third voltage-current converting part and the fourth voltage-current converting part shown in FIG. 2B.

FIG. 5 is another circuit diagram realizing the third voltage-current converting part 420 and the fourth voltage-current converting part 450 shown in FIG. 2B.

Referring to FIG. 5, a third voltage-current converting part 420 includes a third pull-up current source 422, a third pull-down current source 423, a third pull-up switch 424 and a third pull-down switch 425.

The third pull-up current source 422 and the third pull-down current source 423 generate a first current. The third pull-up switch 424 controls the output of the first current generated by the third pull-up current source 422 in response to a signal output from the rear-stage inverter of the third buffer 410. The third pull-down switch 425 controls the output of the first current generated by the third pull-down current source 423 in response to a signal output from the front-end inverter of the third buffer 410.

Accordingly, a current corresponding to the third transmitted voltage signal, that is, a first current is applied to the X-port of the third current conveyor (CC1) 430.

The fourth voltage-current converting part 450 includes a fourth pull-up current source 452, a fourth pull-down current source 453, a fourth pull-up switch 454, and a fourth pull-down switch 455.

The fourth pull-up current source 452 and the fourth pull-down current source 453 generate a second current. In this embodiment, the second current is ½ of the first current. The fourth pull-up switch 454 controls the output of the second current generated by the fourth pull-up current source 452 in response to a signal output from the fourth inverter 440. The fourth pull-down switch 455 controls the output of the second current generated by the fourth pull-down current source 453 in response to a signal applied to the fourth inverter 440.

Accordingly, a current corresponding to the inverted signal of the second transmitted voltage signal, that is, a second current is applied to the X-port of the fourth current conveyor (CC2) 460.

Figure 6:
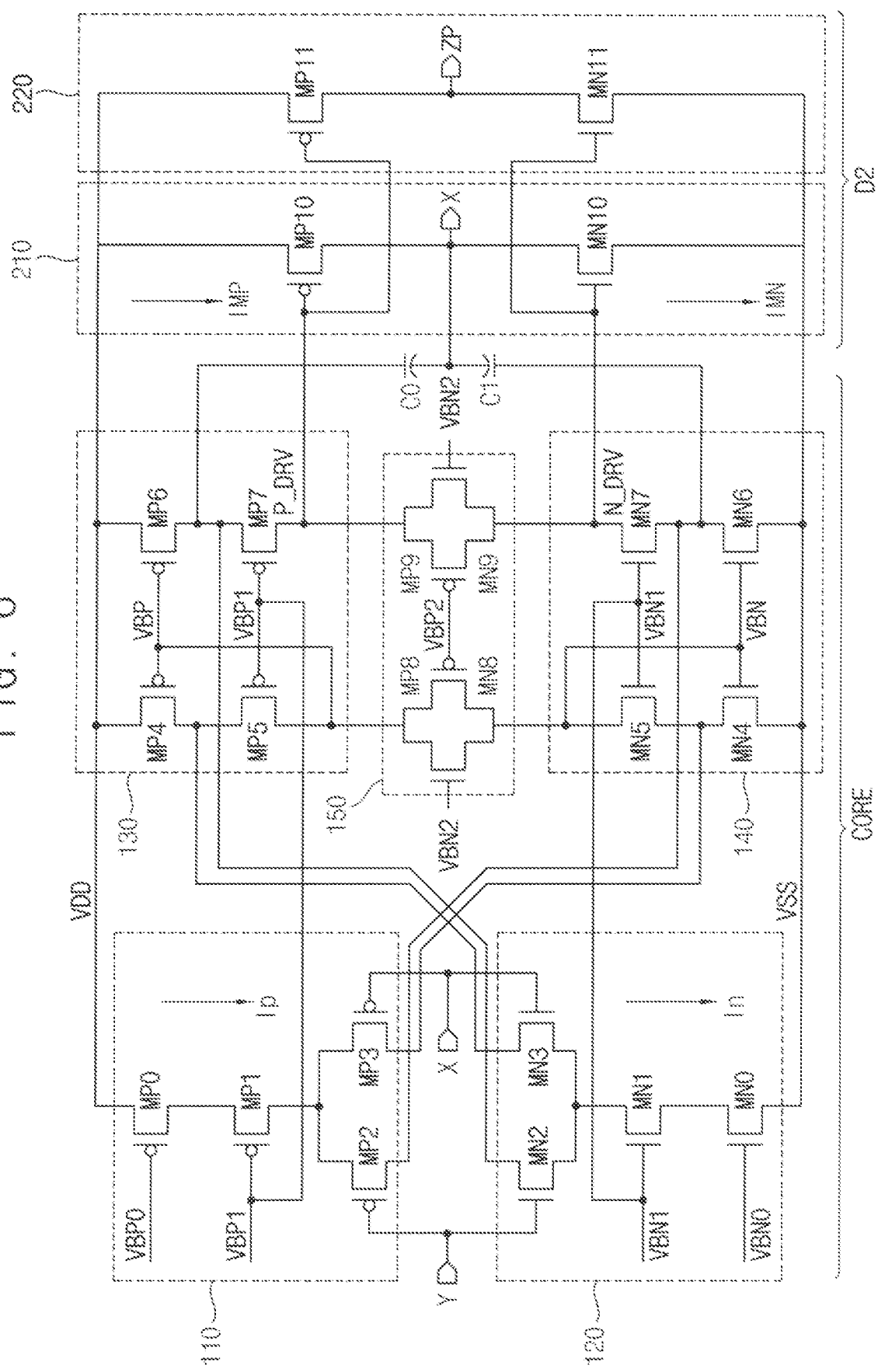
FIG. 6 is a circuit diagram explaining the current conveyor shown in FIG. 2A and FIG. 2B.

FIG. 6 is a circuit diagram explaining the current conveyor shown in FIG. 2A and FIG. 2B. In the present embodiment, it is shown that the current conveyor is a Balanced Output Rail-to-rail Current Conveyor II.

Referring to FIG. 6, the current conveyor includes a core block CORE and a driving block D2.

The core block CORE includes an upper differential input terminal 110, a lower differential input terminal 120, an upper current mirror terminal 130, a lower current mirror terminal 140, a switching terminal 150, a first capacitor C1, and a second capacitor C2. The core block CORE receives VBP0, VBP1, and VBP2 as bias voltages of PMOS, and receives VBN0, VBN1, and VBN2 as bias voltages of NMOS devices from a bias circuit block (not shown). In the balanced output rail-to-rail second-generation current conveyor shown in FIG. 7, the bias circuit block is omitted.

The core block CORE implements rail-to-rail input/output through the upper differential input terminal 110 and the lower differential input terminal 120 commonly connected to the Y-port and the X-port. The core block CORE mirrors the current applied by the bias voltage based on the voltage at the Y-port and the voltage at the X-port, and applies the first driving voltage P_DRV and the second driving voltage N_DRV to the driving block D2.

The upper differential input terminal 110 includes a transistor MP0 and a transistor MP1 connected in series and a transistor MP2 and a transistor MP3 connected in parallel. The transistor MP0 has a source to which a first power voltage VDD is applied, a gate to which a bias voltage VBP0 is applied, and a drain connected to the source of the transistor MP1. The transistor MP1 has a source connected to the drain of the transistor MP0, a gate to which a bias voltage VBP1 is applied, a source of MP2, and a drain connected to the source of the transistor MP3. The transistor MP2 has a source connected to the drain of the transistor MP1, a gate connected to the Y-port, and a drain connected to the lower current mirror terminal 140. The transistor MP3 has a source connected to the drain of the transistor MP1, a gate connected to the X-port, and a drain connected to the lower current mirror terminal 140. The transistors MP2 and MP3 are responsible for input. The transistors MP2 and MP3 compare the voltage of the Y-port and the voltage of the X-port to pass a tail current Ip applied by a bias voltage toward a gate to which a lower voltage is input. Here, a range of an operable input signal voltage (that is, a common mode voltage) is about 2.5V to about 0V, assuming that a first power voltage VDD is about 3.3V.

The lower differential input terminal 120 includes a transistor MN0 and a transistor MN1 connected in series and a transistor MN2 and a transistor MN3 connected in parallel. The transistor MN0 has a drain connected to the source of the transistor MN1, a gate to which a bias voltage VBN0 is applied, and a source to which a second power voltage VSS is applied. The transistor MN1 has a drain connected to a source of the transistor MN2 and the source of the transistor MN3, a gate to which a bias voltage VBN1 is applied, and a source connected to the drain of the transistor MN0. The transistor MN2 has a drain connected to the upper current mirror end 130, a gate connected to the Y-port, and a source connected to the drain of the transistor MN1. The transistor MN3 has a drain connected to the upper current mirror terminal 130, a gate connected to the X-port, and a source connected to the drain of the transistor MN1. The transistors MN2 and MN3 are responsible for the input. The transistors MN2 and MN3 compare the voltage of the Y-port and the voltage of the X-port to pass the current "In" applied by a bias voltage toward the gate to which the higher voltage is input. Here, a range of an operable input signal voltage (that is, a common mode voltage) is about 0.7V to about 3.3V, assuming that a first power voltage VDD is about 3.3V.

Figure 8:
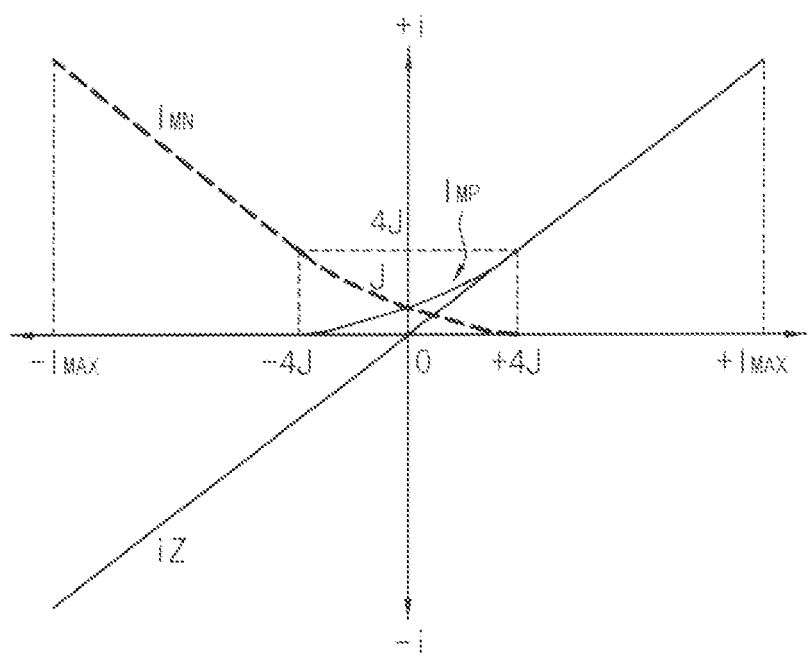
FIG. 8 is a graph explaining current characteristics of transistors MP10 and MN10 provided in the first driver shown in FIG. 6.

Since an upper differential input terminal 110 and a lower differential input terminal 120 are disposed as input stages of the current conveyor, rail-to-rail input may be implemented. That is, when a power supply is 3.3V, the tail currents 'Ip' and 'In' may be supplied so that a range of the common mode voltage covers all of the range of the first power voltage VDD. The range of the input voltage may be expressed as shown in FIG. 8.

Figure 7:
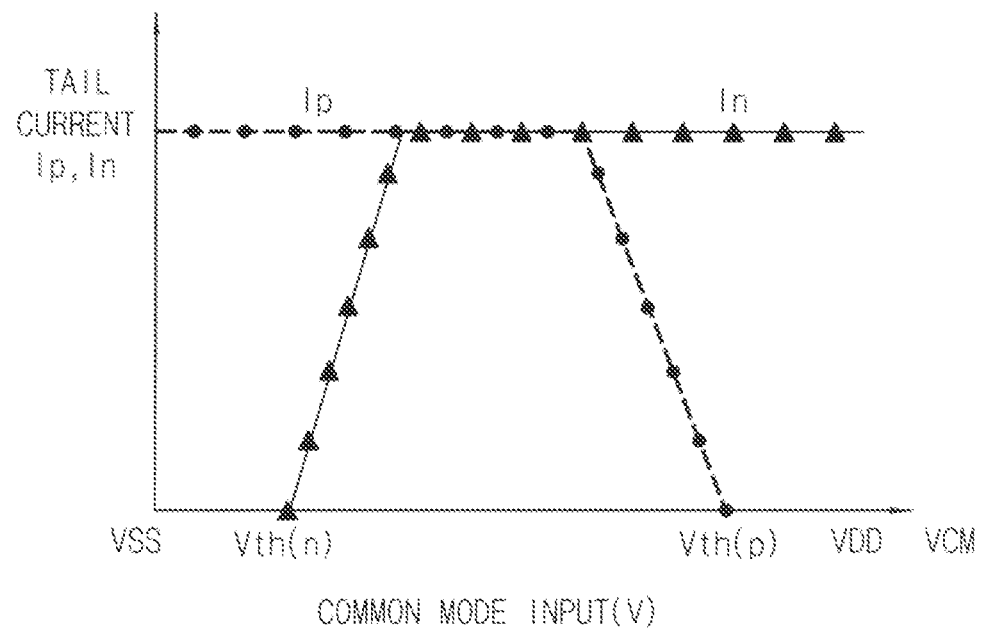
FIG. 7 is a graph explaining a rail-to-rail input.

FIG. 7 is a graph explaining a rail-to-rail input.

As shown in FIG. 7, since the rail-to-rail input covers all of the range of the input signal, 0V to VDD, it may operate with a wider range of input voltage compared to a case where a conventional circuit receives an upper input or a lower input.

Referring again to FIG. 6, the upper current mirror stage 130 includes a transistor MP4, a transistor MP5, a transistor MP6, and a transistor MP7 to define the current mirror. The transistor MP4 has a source to which a first power voltage VDD is applied, a gate connected to a drain of the transistor MP5 and a gate of the transistor MP6, and a drain connected to a source of the transistor MP5. Further, the drain of the transistor MP4 is connected to a source of the transistor MN3 of the lower differential input terminal 120. The transistor MP5 has a source connected to the drain of the transistor MP4, a gate connected to a gate of the transistor MP7, and a drain connected to the gate of the transistor MP4. Further, the source of the transistor MP5 is connected to the source of the transistor MN3 of the lower differential input terminal 120. The transistor MP6 has a source to which a first power voltage VDD is applied, a gate connected to the drain of the transistor MP5 and the gate of the transistor MP4, and a drain connected to a source of the transistor MP7. Further, the drain of the transistor MP6 is connected to a source of the transistor MN2 of the lower differential input terminal 120. The transistor MP7 has a source connected to the drain of the transistor MP6, a gate connected to the gate of the transistor MP5, and a drain connected to a driving block D2 and the switching terminal 150. Here, the transistors MP5 and MP7 are biased by a bias voltage VBP1, and the drain voltage of the transistor MP5 is applied to the transistors MP4 and MP6 as a bias voltage.

When a gate size of the transistor MP4 and a gate size of the transistor MP6 are equal to each other, and a gate size of the transistor MP5 and a gate size of the transistor MP7 are equal to each other, a current flowing through the transistors MP6 and MP7 is equal to a current flowing through the transistors MP4 and MP5. At this time, a saturation voltage of the transistor MP5 is higher than a threshold voltage (Vth) of the transistor MP4, thereby supplying current to the drain of the transistor MP7. Therefore, a range of an operating voltage is wider than that of a general structure of a current mirror.

When a current is applied at different values to each of the drains of the transistors MP4 and MP6 due to the difference in the input voltage of the lower differential input terminal 120, the final output current I (MP7) flowing through the transistor MP7 is determined by the bias current of ±@IN by a bias voltage VBP1. Here, @ is a ratio of the current 'In' to a difference value of an input voltage obtained from the upper differential input terminal 110 and the lower differential input terminal 120, which are input stages of the current conveyor.

The lower current mirror stage 140 includes a transistor MN4, a transistor MN5, a transistor MN6, and a transistor MN7 to define the current mirror. The transistor MN4 has a drain connected to a source of the transistor MN5, a gate connected to a gate of the transistor MN6, and a source to which a second power voltage VSS is applied. Further, the drain of the transistor MN4 is connected to the source of the transistor MP3 of the upper differential input terminal 110. The transistor MN5 has a drain connected to the switching terminal 150, a gate connected to a gate of the transistor MN7, and a source connected to the drain of the transistor MN4. Further, the source of the transistor MN5 is connected to the source of the transistor MP2 of the upper differential input terminal 110. The transistor MN6 has a drain connected to a source of the transistor MN7, a gate connected to the gate of the transistor MN4, and a source to which a second power voltage VSS is applied. The transistor MN7 has a drain connected to the switching terminal 150, a gate connected to the gate of the transistor MN5, and a source connected to the drain of the transistor MN6. Further, the drain of the transistor MN7 is connected to the source of the transistor MP2 of the upper differential input terminal 110. Here, the transistors MN5 and MN7 are biased with a bias voltage VBN1, and the source voltage of the transistor MN5 is applied as bias voltages of the transistors MN4 and MN6.

When a gate size of the transistor MN4 and a gate size of the transistor MN6 are equal to each other, and a gate size of the transistor MN5 and a gate size of the transistor MN7 are equal to each other, a current flowing through the transistors MN6 and MN7 is equal to a current flowing through the transistors MN4 and MN5. At this time, a saturation voltage of the transistor MN5 is higher than a threshold voltage (Vth) of the transistor MN4, thereby supplying current to the drain of the transistor MN7. Therefore, a range of an operating voltage is wider than that of a general structure of a current mirror.

At this time, when current is applied at different values to each sources of the transistors MN4 and MN6 due to the difference in the input voltage of the upper differential input terminal 110, the final output current I (MN7) flowing through the transistor MN7 is determined by the bias current of ±@IP by a bias voltage VBN1. Here, @ is a ratio of the current (Ip) to a difference value of an input voltage obtained from the upper differential input terminal 110 and the lower differential input terminal 120, which are input stages of the current conveyor.

In the present embodiment, the upper current mirror stage 130 and the lower current mirror stage 140 employ a high-compliance current mirror.

The driving block D2 includes a first driver 210 and a second driver 220, and outputs a normal output current through the ZP-port in response to the first driving voltage P_DRV and the second driving voltage N_DRV.

The first driver 210 includes a transistor MP10 and a transistor MN10 connected in series. The transistor MP10 has a source to which a first power voltage VDD is applied, a gate connected to the upper current mirror terminal 130, and a drain connected to a drain of the transistor MN10 and a drain connected to the X-port. The transistor MN10 has a source to which a second power voltage VSS is applied, a gate connected to the lower current mirror terminal 140, and a drain connected to a drain of the transistor MP10 and the X-port. The first driver 210 performs the role of connecting the output to the X-port of the input stage to fit the structure of a second-generation current conveyor.

FIG. 8 is a graph explaining current characteristics of transistors MP10 and MN10 provided in the first driver 210 shown in FIG. 6.

As shown in FIG. 8, the output current $I_{MP}$ of the transistor MP10 is controlled by the first driving voltage P_DRV, which is the output of the upper current mirror stage 130. The transistor MP10 operates in a linear mode in a section where the output current $I_{MP}$ is greater than +4J, and has a nonlinear characteristic in a section where the output current $i_{MP}$ is less than +4J. The transistor MP10 is cut-off in a period of −4J or less so that it cannot drive current anymore. Here, J denotes a standby mode current (i.e., a value of a current flowing before operation in a standby state) as a quiescent current of a driving MOSFET. Class AB drivers are designed by defining the section of the bias voltage before the gate voltage of each driver MOS passes the threshold voltage and reaches the linear operation mode as a section of about ±4J.

Meanwhile, the output current $i_{MN}$ of the transistor MN10 is controlled by the second driving voltage N_DRV, which is the output of the lower current mirror stage 140. The transistor MN10 operates in a linear mode in a section where the output current $i_{MN}$ is less than −4J, and the transistor MN10 has a nonlinear characteristic in a section greater than −4J. The transistor MN10 is cut-off in a section of +4J or more, so it cannot drive current any more.

Therefore, the current values of the transistors MP10 and MN10 exist in zero current section without signal (i.e., no signal section), but have the smallest current values in an operation mode, so this this output buffer stage is called a class AB stage. A driver with this function is called a Class AB driver. In addition, by using a current conveyor with such a class AB driver, it is possible to reduce the current consumption when there is no signal. Moreover, the size of the output driver is appropriately adjusted to suit the application, and it is possible to drive low-power operation characteristics and drive a large current.

Referring back to FIG. 6, the second driver 220 includes a transistor MP11 and a transistor MN11 connected in series in the same manner as the structure of the first driver 210. The transistor MP11 has a source to which a first power voltage VDD is applied, a gate connected to the gate of the transistor MP10 of the first driver 210, and a drain connected to a drain of the transistor MN11 and the ZP-port. The transistor MN11 has a source to which a second power voltage VSS is applied, a gate connected to the lower current mirror terminal 140 and the gate of the transistor MN10, and a drain connected to the drain of the transistor MP11 and the ZP-port. Unlike the first driver 210 being connected to the X-port of the differential input stage of the upper differential input terminal 110 and the lower differential input terminal 120, the second driver 220 is connected to the ZP-port for output driving.

Then, hereinafter, when a one-way signal is transmitted from the first communication module (or A-side) 300 to the second communication module (or B-side) 400, a process of restoring an RX signal by the first communication module 300 and a process of restoring an RX signal by the second communication module 400 will be described. In addition, when a bidirectional signal is simultaneously transmitted between the first communication module 300 and the second communication module 400, a process of restoring the RX signal by the first communication module 300 and a process of restoring the RX signal by the second communication module 400 will be described. In the present embodiment, the first communication module 300 may transmit a signal and the second communication module 400 may receive the transmitted signal. Alternatively, the second communication module 400 may transmit a signal and the first communication module 300 may receive the transmitted signal.

<One-Way Signal Transmission from A-Side to B-Side>

First, a case where a one-way signal is transmitted from the A-side to the B-side will be described with an equation. That is, it will be described that the second current conveyor (CC2) 360 and the fifth current conveyor (CC5) 460 are removed from the A-side and the B-side, respectively, and the second input terminal TXB, the second buffer 410 and the third voltage-current converting part 420 are removed from the B-side.

The A-side transmission signal TXA is the same as TXA=$V_{TXA}$ Here, the A-side transmission signal TXA may be a sine wave, a sinusoidal wave, and a voltage signal having an eye pattern.

The Y-port of the first current conveyor (CC1) 330 is connected to a common voltage VCOM. Here, the common voltage VCOM may be a half voltage of a first power voltage VDD. Alternatively, the common voltage VCOM may be an arbitrary voltage between 0V and VDD in an actual application. Since the voltage at the X-port is the common voltage VCOM due to the characteristics of the current conveyor, the voltage at the X-port is generally expressed by substituting 0V for convenience of calculation when the common voltage VCOM is applied to the Y-port or supplied. Alternatively, the voltage at the X-port becomes 0V when the power supply is +VDD to −VDD.

The current by the output terminal of the A-side first buffer 310 (that is, a buffer having a low output impedance, and two inverters are usually used) and the first voltage-current converter connected to the X-port of the first current conveyor (CC1) 330 (i.e., Current-to-Voltage converting (CV) resistance), that is, the A-side transmitted current, is expressed as $i_{TXA}=V_{TXA}/R$ by the voltage-current equation. Here, although $V_{TXA\_effective}=V_{TXA}-V_{CM}$, $V_{CM}$ is regarded as a constant and replaced with 0 for convenience of calculation.

At this time, the sum of a transmitted current $i_{TXA}$ input in a direction of an X-port of the first current conveyor (CC1) 330, a current $i_{ACC1X}$ output through the X-port of the first current conveyor (CC1) 330, a current $i_{BCC1X}$ supplied through the X-port of a second end of the first current conveyor (CC1) 330 supplied from the single-wire 10, and a transmitted current $i_{TXB}$ output through the second end of the first current conveyor (CC1) 330 is 0.

The reason why the sum is 0 is as follows.

The X-ports are low-impedance ports having a common voltage VCOM due to the characteristics of the second-generation current conveyor (CCII). This is because the voltage is maintained as a common voltage VCOM, only the current applied to the X-port is monitored, the same current is supplied in the reverse direction, and the current in the X-port is sensed to generate a reverse current with the same value to the ZP-port. Moreover, the circuit configuration was designed to work that way.

Since the first current conveyor (CC1) 330 on the A-side and the fourth current conveyor (CC4) 430 on the B-side are configured with the same current driving circuit in the same structure, the first current conveyor (CC1) 330 on the A-side and the fourth current conveyor (CC4) 430 on the B-side have the same output current.

Therefore, since the X-ports of the A-side and B-side equally divide the transmitted current and supply the current having the opposite phase, the current equation according to the above relationship is expressed as Equation (1). Here, since the line resistance of the single-wire is close to zero ohm (0Ω) and the voltage fluctuation on the communication line is almost unchanged, an IR drop (i.e., voltage drop due to resistance and current) that is common in the line is negligible. Therefore, a wire line model may be implemented as an actual system even if it is not reflected in the calculation of the equation below:

$$i_{TXA}+i_{ACC1X}+i_{wire}+i_{TXB}=0 \qquad (1)$$

Since there is no input signal of the second input terminal TXB, it is expressed by following Equation (2):

$$i_{TXB}=0 \qquad (2)$$

As a result, a current equation of a wire, which is a signal transmission medium, is the same as a current of the X-port of the A-side first current conveyor (CC1) 330. This current is applied as it is to the X-port of the B-side fourth current conveyor (CC4) 430, and a current applied to the X-port of the B-side fourth current conveyor (CC4) 430 is mirrored and output through the ZP-port of the B-side fourth current conveyor (CC4) 430. In addition, a current applied to the X-port of the A-side first current conveyor (CC1) 330 is mirrored in an inverse and output through the ZP-port of the A-side first current conveyor (CC1) 330. The above description is summarized as Equation (3):

$$i_{wire}=i_{ACC1X}=i_{ACC1ZP}=i_{BCC1X}=i_{BCC1ZP} \qquad (3)$$

Substituting Equation (3) into Equation (1) is as follows:

$$i_{TXA}+i_{wire}+i_{wire}=0 \qquad (4)$$

Equation (4) is summarized as:

$$2i_{wire}=i_{TXA} \qquad (5)$$

Eventually, the current equation flowing through the wire is equal to the value of the TX transmitted current of the inverted ½ of the A-side (of the transmitted current):

$$i_{wire}=-\tfrac{1}{2}i_{TXA} \qquad (6)$$

Applying Equation (3) to Equation (6) is as:

$$i_{BCC1ZP}=-\tfrac{1}{2}i_{TXA} \qquad (7)$$

$$i_{ACC1ZP}=-\tfrac{1}{2}i_{TXA} \qquad (8)$$

Therefore, since the ZP-port of the first current conveyor (CC1) 330 on the A-side, which is the transmitting side, inverts the input current of the X-port of the first current conveyor (CC1) 330 and mirrors the output, the relationship of Equation (8) is established. In addition, since the ZP-port of the B-side fourth current conveyor (CC4) 430, which is the receiving side, inverts and mirrors the input current of the X-port of the fourth current conveyor (CC4) 430, the relationship of Equation (7) is established. In summary, the equation is equivalent to the following:

$$i_{ACC1X} = i_{ACC1ZP} = i_{BCC1X} = i_{BCC1ZP} = -\tfrac{1}{2} i_{ATX} \tag{9}$$

That is, the ZP-port current of the A-side first current conveyor (CC1) 330 has the same value as the ZP-port current of the B-side fourth current conveyor (CC4) 430. The ZP-port current of the A-side first current conveyor (CC1) 330 has a half value of the transmitted current on the A-side, and has a current value whose polarity is opposite.

Using this, a CV (Current-to-Voltage) converter is designed by placing an OP-AMP at an output terminal of the B-side ZP-port. When a resistance value of the amplifier resistor connected to the OP-AMP is twice the resistance value used for A-side CV conversion and the CV converted signal is inverted and output, the A-side transmission signal is mirrored to the B-side as it is. As a result, the A-side transmission signal passes through the single-wire 10 and is received without loss at the B-side.

In particular, when an output of the ZP-port of the B-side fourth current conveyor (CC4) 430 and an output of the ZP-port of the fifth current conveyor (CC5) 460 are connected so that a summed current is input to the X-port of the sixth current conveyor (CC6) 470, an input current of the fifth current conveyor (CC5) 460 is mirrored (or replicated) to the ZP-port of the sixth current conveyor (CC6) 470 by the characteristic of a current conveyor.

After the duplicated current is changed to a voltage by the second OP-AMP 482 and passes through the inverter, the value of the A-side transmission signal TXA transmitted from the A-side is directly received at the B-side second output terminal RXB. Here, since the A-side signal is unidirectionally transmitted to the B-side, the TXB enable signal for controlling the second buffer 410 and the third inverter 440 is in a disabled state.

Accordingly, since outputs of the second buffer 410 and the third inverter 440 are in a high impedance state (i.e., a zero or zero current input state), a current applied to the third voltage-current converter 420 and the fourth voltage-current converter 450 has a value of zero.

For this reason, a current applied to the X-port of the CC4 430 is not affected by the fifth current conveyor (CC5) 460 and is half of the current generated from the A-side transmission signal TXA. Moreover, since there is no current applied to the ZP-port of the fifth current conveyor (CC5) 460, the current input to the X-port of the sixth current conveyor (CC6) 470 is half of the current generated from the A-side transmission signal TXA. In order to replicate the voltage amplitude of the transmitted signal as it is, it is sufficient if a value of the second amplifier resistor 484 used for CV conversion is 2R (here, R is a resistance value of the first voltage-current converter 320).

On the other hand, when the fourth inverter 490 is set to have a resistance value of a level capable of recognizing an input signal voltage as a logic level as necessary, an operation of a circuit perfectly performs a desired signal transmission. At this time, it was recognized that there is no problem in operation if the second amplifier resistor 484 is typically 0.5R to 4R through an experiment. Here, R is the resistance value of the first voltage-current converter 320. Equations (10) to (13) below describe a case where the second amplifier resistor 484 is 2R.

In addition, the values of R, which is the resistance value of the first voltage-current converter 320 used for transmission, and 2R, which is the resistance value of the fourth voltage-current converter 450 used for reception, were recognized to be capable of transmitting and receiving signals without any problem even with +/−30% variation, which is a manufacturing distribution of resistance components used in the general semiconductor manufacturing process:

$$RXB = V_{RXB} \tag{10}$$

$$V_{RXB} = -(i_{BCC1ZP} \times 2R) \tag{11}$$

$$V_{RXB} = -\tfrac{1}{2} i_{TXA} \times -2R \tag{12}$$

$$V_{RXB} = i_{TXA} \times R = V_{TXA} \tag{13}$$

Moreover, using this, a CV (Current-to-Voltage) converter is designed by placing an OP-AMP at an output terminal of the A-side ZP-port. When a resistance value of the amplifier resistor connected to the OP-AMP is twice the resistance value used for B-side CV conversion and the CV converted signal is inverted and output, the B-side transmission signal is mirrored to the A-side as it is. As a result, it is possible to monitor a signal that a A-side transmission signal is normally transmitted to the B-side via a single-wire. The above matter may be explained through Equations (14) to (17) below:

$$RXA = V_{RXA} \tag{14}$$

$$V_{RXA} = -(i_{ACC1ZP} \times 2R) \tag{15}$$

$$V_{RXA} = -\tfrac{1}{2} i_{TXA} \times -2R \tag{16}$$

$$V_{RXA} = i_{TXA} \times R = V_{RXA} \tag{17}$$

In addition, when noise on the line is removed by adding an analog low pass filter or a timing glitch filter to the first output terminal RXA or the second output terminal RXB, a one-wire communication system with higher reliability may be implemented.

<Simultaneous Bidirectional Signal Transmission Between A-Side and B-Side>

Hereinafter, a case in which a bidirectional signal is transmitted between the A-side and the B-side at the same time will be described with an equation. In particular, a transmission method implemented by including all of the second current conveyor (CC2) 360, the fifth current conveyor (CC5) 460 and the CV converters of each of the A-side and B-side will be described.

The A-side transmission signal TXA is the same as TXA=$V_{TXA}$, and the B-side transmission signal TXB is the same as TXB=$V_{TXB}$. Here, each of the A-side transmission signal TXA and the B-side transmission signal TXA may have a sine wave, a sine wave, or a voltage signal having an eye pattern.

A current by the output terminal of the A-side first buffer (i.e., a buffer having a low output impedance, and two inverters are usually used) and the amplifier resistance (i.e., a current-to-voltage (CV) converting resistance) connected to the X-port of the first current conveyor (CC1) 330 is expressed as $i_{TXA} = V_{TXA}/R$.

A current by the output terminal of the B-side first buffer (i.e., a buffer having a low output impedance, and two inverters are usually used) and the first voltage-current converter 320 connected to the X-port of the first current conveyor (CC1) 330, that is, the B-side transmitted current is expressed as $i_{TXB}=V_{TXB}/R$ by a voltage-current equation.

Here, the sum of a transmitted current ($i_{TXA}$, $i_{TXB}$) input to the X-port of the first current conveyor (CC1) 330 and the fourth current conveyor (CC4) 430 of each of the A-side and the B-side, respectively, a current ($i_{ACC1X}$, $i_{BCC1X}$) output to the X-port of the first current conveyor (CC1) 330 and the fourth current conveyor (CC4) 430, and a current ($i_{ACC1X}$, $i_{BCC1X}$) supplied from the X-port of the first current conveyor (CC1) 330 of another end supplied from the wire is zero. Since the A-side first current conveyor (CC1) 330 and the B-side fourth current conveyor (CC4) 430 are composed of an equivalent circuit (that is, the same current driving circuit with the same structure), each of the X-ports equally divides the transmitted current to supply the current having the opposite phase. Therefore, the above relational current equation is expressed by the A-side relational expression (Equation (18)) or the B-side relational expression (Equation (19)) as follows:

$$i_{TXA}+i_{ACC1X}+i_{wire}+i_{TXB}=0 \quad (18)$$

$$i_{TXA}+i_{BCC1X}+i_{wire}+i_{TXB}=0 \quad (19)$$

Either of the relational expression of the A-side and the relational expression of the B-side is processed in the same manner, but Equation (18) is applied in order to explain the transmission/reception on the A-side:

$$i_{TXB} \neq 0 \text{ or } i_{TXB}=0 \quad (20)$$

Since there may or may not be an input signal from the TXB side, a transmitted current of the B-side is included in the calculation:

$$i_{wire}=i_{ACC1X}=i_{ACC1ZP}=i_{BCC1X}=i_{BCC1ZP} \quad (21)$$

Consequently, a current equation of the wire, which is a signal transmission medium, is equal to the sum of the current at the X-port of the A-side first current conveyor (CC1) 330 and the current at the X-port of the B-side fourth current conveyor (CC4) 430. The sum of these currents is directly applied to the X-ports of each of the A-side first current conveyor (CC1) 330 and the B-side fourth current conveyor (CC4) 430, and the current applied to the X-ports is mirrored to the ZP-ports of each of the A side and B side.

Substituting Equation (21) to Equation (18) for the left and right sides are as:

$$i_{TXA}+i_{wire}+i_{wire}+i_{TXB}=0 \quad (22)$$

The left and right sides are summarized as:

$$2i_{wire}=-(i_{TXA}+i_{TXB}) \quad (23)$$

As a result, the current flowing through the wire becomes a half component in which the sum of the A-side transmitted current and the B-side transmitted current is inverted:

$$i_{wire}=-\tfrac{1}{2}(i_{TXA}+i_{TXB}) \quad (24)$$

$$i_{wire}=-\tfrac{1}{2}(i_{TXA}+i_{TXB})=i_{ACC1ZP}=i_{BCC1X}=i_{BCC1ZP} \quad (25)$$

When Equation (25) is applied to Equation (21), which is the output current equation of the ZP-port of the A-side first current conveyor (CC1) 330, it is as follows:

$$i_{ACC1ZP}=-\tfrac{1}{2}(i_{TXA}+i_{TXB}) \quad (26)$$

When Equation (25) is applied to Equation (21), which is the output current equation of the ZP-port of the B-side fourth current conveyor (CC4) 430, it is as follows:

$$i_{BCC1ZP}=-\tfrac{1}{2}(i_{TXA}+i_{TXB}) \quad (27)$$

At this time, in order to simultaneously transmit and receive the signal TXB transmitted from the B-side in a full duplex method while transmitting the signal TXA from the A-side, the A-side second current conveyor (CC2) 360 is used to remove the transmission signal existing in the ZP-port of the A-side first current conveyor (CC1) 330.

In order to receive the B-side signal from the A-side, the transmission signal of the A-side is removed.

The signal to be removed is as:

$$-\tfrac{1}{2}i_{TXA} \quad (28)$$

In order to make the above cancellation signal, a second buffer (i.e., an inverting buffer) on the A-side is provided, and a voltage signal having the same amplitude as the driving signal of TXA and having an inverse phase is generated. The CV resistor constitutes a second voltage-current converter. A resistance value of the second voltage-current converting part uses a resistance that is twice a resistance value of the first voltage-current converting part.

In another example, even if the second voltage-current converting part uses a resistance having a same resistance value as a resistance value of the first voltage-current converting part, and a current conversion ratio of the second current conveyor (CC2) 360 is configured as ½, it may obtain the same results.

<Signal Restoration Process of the A-Side>

Hereinafter, a process of restoring the RX signal in the A-side will be described.

A current by an output terminal of the second buffer 410 of the A-side and the amplifier resistor 2R connected to the X-port of the second current conveyor (CC2) 360, that is, a current for subtracting the transmission signal of the A-side is expressed as follows:

$$i_{TXAN}=-V_{TXA}/2R \quad (29)$$

Here, a sign of minus (−) is attached because a voltage is inverted.

A current of the ZP-port of second current conveyor (CC2) 360, which is input to the X-port of the A-side second current conveyor (CC2) 360, is mirrored and output, is expressed as follows:

$$i_{ACC2ZP}V_{TXA}/2R=\tfrac{1}{2}i_{TXA} \quad (30)$$

That is, it is reversed again.

A current equation obtained by connecting the ZP-ports of each of the A-side first current conveyor (CC1) 330 and the A-side second current conveyor (CC2) 360 with separate wires from the relational equation between the X-port and the ZP is as follows:

$$i_{RXA}=i_{ACC1ZP}+i_{ACC2ZP} \quad (31)$$

$$i_{RXA}=-\tfrac{1}{2}(i_{TXA}+i_{TXB})+\tfrac{1}{2}i_{TXA} \quad (32)$$

Substituting Equation (26) and Equation (30) are as:

$$i_{RXA}=-\tfrac{1}{2}i_{TXB} \quad (33)$$

As a result, a current of the first output terminal RXA of the A-side is the inverted half of the signal current transmitted from the B-side. This means that the signal current generated while transmitting from the A-side is canceled using the second current conveyor (CC2) 360, and only the signal transmitted from the B-side is restored.

Using this, to output the current (iRXA) on the A-side, a CV converter is designed using an OP-AMP, and a resistance value of an amplifier resistor connected to the OP-AMP is twice a resistance value used for CV conversion on the B-side. When a CV conversion signal is inverted and output, a B-side transmission signal applied to the line is mirrored to a first output terminal RXA of the A-side as it is.

As a result, the B-side transmit signal normally passes through the single-wire 10 and is received without loss at the A-side.

In particular, when an output of the ZP-port of the A-side first current conveyor (CC1) 330 and an output of the ZP-port of the second current conveyor (CC2) 360 are connected so that a summed current is input to the X-port of the third current conveyor (CC3) 370, an input current is mirrored (or replicated) to the ZP-port of third current conveyor (CC3) 370 by the characteristic of a current conveyor.

When the mirrored current passes through the second inverter 390 after being changed to a voltage by the first OP-AMP 382, the value of the B-side transmission signal TXB transmitted from the B-side is directly received at the A-side first output terminal RXA. At this time, since it operates as a two-way transmission/reception function that transmits the A-side signal (TXA) to the B-side (RXB) and simultaneously transmits the B-side signal (TXB) to the A-side (RXA), the TXA Enable signal enabling the first buffer 310 and the first inverter 340 of the A side is set to an enable state. Similarly, the TXB Enable signal for enabling the second buffer 410 and the third inverter 440 of the B-side is set to the enable state.

Each of the reception circuits of the A-side and the B-side can selectively receive only the signal of the opposite side only by circuitry canceling their own transmission signal. Here, the receiving circuits on the A-side are denoted by reference numerals 370, 382 and 390, and the receiving circuits on the B-side are denoted by the reference numerals 470, 482 and 490. Here, from the standpoint of the receiver of the A-side, the signal of the opposite side is a signal transmitted from the B-side, and the signal of the opposite side is a signal transmitted from the side of the B side.

The offset circuits for canceling its own transmission signal from the A side are 340, 350, and 360, and the canceling circuits for canceling its own transmission signal from the B side are denoted by the reference numerals 440, 450 and 460.

Since the reception signal and the cancellation circuit of each A-side and B-side are the same, only the reception circuit and the cancellation circuit of the A-side will be described below for convenience of description.

A transmission signal voltage applied through a first input terminal TXA is changed to a signal current through a first voltage-current converter 320, and the signal current is provided to a X-port of the A-side first current conveyor (CC1) 330 and a X-port of the B-side CC4 430. Accordingly, the magnitude of the current flowing through the first voltage-current converter 320 is canceled by the A-side first current conveyor (CC1) 330 and the B-side fourth current conveyor (CC4) 430 to have a value of zero. Each of first current conveyor (CC1) 330 and fourth current conveyor (CC4) 430 has a current signal having an opposite sign and a magnitude of ½ compared to a current of the first voltage-current converter 320.

The current signal having an opposite sign and a magnitude of ½ is input to the X-port of the third current conveyor (CC3) 370 through the ZP-port of first current conveyor (CC1) 330 on the A side, and a signal transmitted through the first input terminal TXA is fed back to a first output terminal RXA. Since this feedback current signal interferes with receiving the current signal input from the B side, it must be canceled (removed). In order to cancel (or remove) the self-feedback signal, an output terminal (e.g., ZP-port) of the second current conveyor (CC2) 360 to which the second voltage-current converter 350 is connected is connected to an output terminal (e.g., ZP-port) of the first current conveyor (CC1) 330. Here, the second voltage-current converter 350 has a phase opposite to the TXA signal of the A-side and 2R, which is twice the resistance of R of the first voltage-current converter 320.

Accordingly, an output current signal is output through the ZP-port of the second current conveyor (CC2) 360. Here, the output current signal has a current value corresponding to ½ of a current signal output through the ZP-port of the first voltage-current converter 320 by the TAX signal, and a phase opposite to a phase of the current signal through the ZP-port. When the current of the ZP-port of the second current conveyor (CC2) 360 and the current of the ZP-port of the first current conveyor (CC1) 330 are connected through a single-wire, a current signal having the same magnitude and opposite phase is added by the single-wire. Thus, the result value will be about 0. Since the result value is input to the X-port of third current conveyor (CC3) 370, the transmission signal of the A-side is canceled and is not reflected in a reception signal of the A-side.

At this time, when a transmit signal (i.e., current) is applied from the B-side to the single-wire 10, a receiving circuit of the A-side may detect only a transmit signal of the B-side regardless of a transmit signal of the A-side and may restore a voltage. The above description may be explained through Equations (34) to (38) below:

$$RXA = V_{RXA} \quad (34)$$

$$RXA = -(i_{RXA} * 2R) \quad (35)$$

$$V_{RXA} = (-\tfrac{1}{2} i_{TXB} \times 2R) \quad (36)$$

$$V_{RXA} = \tfrac{1}{2} i_{TXB} \times 2R \quad (37)$$

$$V_{RXA} = i_{TXB} \times R = V_{TXB} \quad (38)$$

<Signal Restoration Process of B-Side>

Hereinafter, a process of restoring the RX signal of the B-side will be described. Here, only symbols and signs are changed in the restoration process of the A-side and described again.

A current by the amplifier resistor 2R connected to the output terminal of the second buffer 410 of the B-side and the X-port of the fifth current conveyor (CC5) 460, that is, a current for subtracting a transmit signal of the B-side is expressed as Equation (39) below:

$$i_{TXBN} = -V_{TXB}/2R \quad (39)$$

When the above current is input to the X-port of the fifth current conveyor (CC5) 460 of the B-side, a current output through the ZP-port of the fifth current conveyor (CC5) 460, which is reversely mirrored, is expressed as Equation (40) below:

$$i_{BCC2ZP} = V_{TXB}/2R = \tfrac{1}{2} i_{TXB} \quad (40)$$

A current equation obtained by connecting the ZP-ports of fourth current conveyor (CC4) 430 and fifth current conveyor (CC5) 460 of the B side with separate wires is as follows:

$$i_{RXB} = i_{BCC1ZP} + i_{BCC2ZP} \quad (41)$$

$$i_{RXB} = -\tfrac{1}{2}(i_{TXA} + i_{TXB}) + \tfrac{1}{2} i_{TXB} \quad (42)$$

$$i_{RXB} = -\tfrac{1}{2} i_{TXA} \quad (43)$$

As a result, a current of the second output terminal RXB of the B-side is the inverted half of the signal current transmitted from the A-side. This means that the signal current generated while transmitting from the B-side is canceled using the fifth current conveyor (CC5) 460, and only the signal transmitted from the A-side is restored.

Using this, to output the current (iRXB) on the B-side, a CV converter is designed using an OP-AMP, and a resistance value of an amplifier resistor connected to the OP-AMP is twice a resistance value used for CV conversion on the A-side. When a CV conversion signal is inverted and output, a A-side transmission signal applied to the line is mirrored to a second output terminal RXB of the B-side as it is. As a result, the A-side transmit signal normally passes through the single-wire 10 and is received without loss at the B-side.

In particular, when an output of the ZP-port of the B-side fourth current conveyor (CC4) 430 and an output of the ZP-port of the fifth current conveyor (CC5) 460 are connected so that a summed current is input to the X-port of the sixth current conveyor (CC6) 470, an input current is mirrored (or replicated) to the ZP-port of the sixth current conveyor (CC6) 470 by the characteristic of a current conveyor.

When the mirrored current passes through the fourth inverter 490 after being changed to a voltage by the second OP-AMP 482, the value of the A-side transmission signal TXA transmitted from the A-side is directly received at the B-side second output terminal RXB.

An operation of a receiving circuit of the B-side is the same as an operation of a receiving circuit of the A-side described previously. The above matter may be explained through Equations (44) to (48) below:

$$RXB = V_{RXB} \quad (44)$$

$$RXB = -(i_{RXB} * 2R) \quad (45)$$

$$V_{RXB} = (-\tfrac{1}{2} i_{TXA} \times 2R) \quad (46)$$

$$V_{RXB} = \tfrac{1}{2} i_{TXA} \times 2R \quad (27)$$

$$V_{RXB} = i_{TXA} \times R = V_{TXA} \quad (48)$$

In the same way as above, the A-side and the B-side may implement a one-wire communication system capable of transmitting and receiving at the same time.

Typically, the first communication module and the second communication module are directly connected to communicate with each other through a designated interface (e.g., single wire protocol (SWP), universal serial bus (USB), universal asynchronous receiver/transmitter (UART), serial peripheral interface (SPI), and inter-integrated circuit (I2C)).

However, according to the present invention, each of the first communication module and the second communication module is configured to include a plurality of current conveyors, and the first communication module and the second communication module are directly connected through a single-wire to communicate with each other. Accordingly, by reducing the number of pins (or pads) for data transmission between chips to one, the number of pins may be reduced, price competitiveness of chips may be improved, and power consumption may be reduced.

Figure 9A:
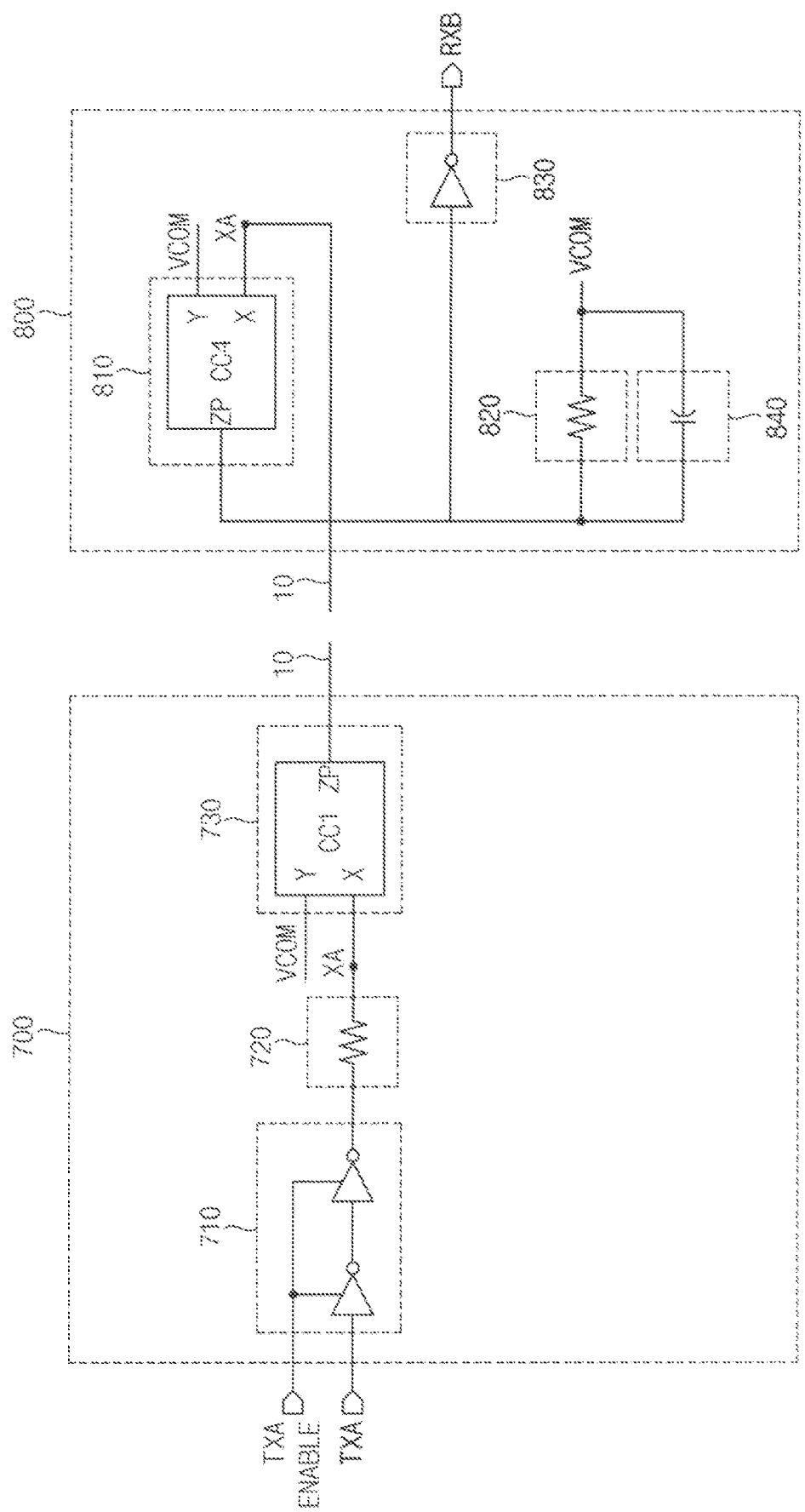
FIG. 9A and FIG. 9B are circuit diagrams explaining another example of a single-wire communication system shown in FIG. 1.
Figure 9B:
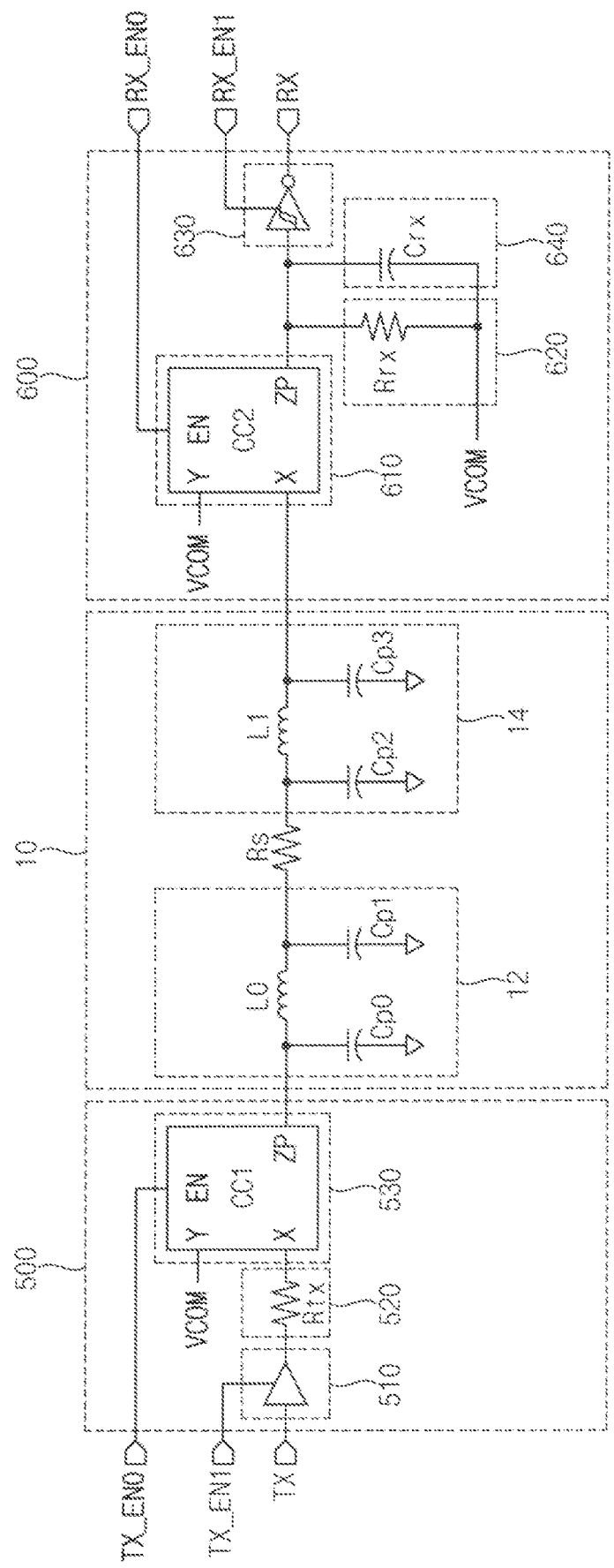

FIG. 9A and FIG. 9B are circuit diagrams explaining another example of a single-wire communication system shown in FIG. 1.

FIG. 1, FIG. 9A, and FIG. 9B, the single-wire communication system includes a single-wire 10, a first communication module 500 and a second communication module 600. The single-wire communication system performs a unidirectional communication through a single-wire while enabling high-speed long-line communication by making almost no voltage change on a wired communication line (i.e., a single-wire 10) during communication.

The first communication module 500 includes a buffer 510, a voltage-current converter 520 and a first current conveyor (CC1) 530, and the second communication module 600 includes a is a second current conveyor (CC2) 610, a current-voltage converter 620 and an inverter 630.

The buffer 510 is connected to an input terminal TXA for receiving a transmitted voltage signal from an external device (not shown). The buffer 510 buffers the transmitted voltage signal and then provides the buffered transmitted voltage signal to the voltage-current converter 520. In the present exemplary embodiment, the buffer 510 includes a front-end inverter and a rear-end inverter connected in series. In the present exemplary embodiment, the buffer 510 applies the TXA value to the voltage-current converter 520 when the TXA enable pin is active, and floats when the TXA enable pin is inactive. In the present exemplary embodiment, a reference numeral TXA is used interchangeably as an input terminal and a transmitted voltage signal. In the present exemplary embodiment, the buffer 510 may be used for sufficient amplitude since the output current is low.

The voltage-current converter 520 includes a first resistor. The first resistor has one end connected to the buffer 510 and another end connected to the first current conveyor 530. The first resistor converts the buffered transmitted voltage signal into a current and provides the converted current to the first current conveyor 530. That is, the voltage-current converter 520 performs the role of converting a voltage into a current.

The first current conveyor 530 includes an X-port connected to the other end of the voltage-current converter 520, a Y-port to which a common voltage VCOM is applied, and a ZP-port connected to the single-wire 10. The first current conveyor 530 mirrors a current sensed at the X-port and outputs it to the single-wire 10 through the ZP-port. In the present exemplary embodiment, the first current conveyor 530 is activated in response to an enable signal, and is deactivated in response to a disable signal. In the structure of a typical current conveyor, when a voltage of the Y-port is set to a common voltage VCOM, a voltage of the X-port also maintains a level of the common voltage VCOM. At this time, even when there is a current signal flowing into the X-port, a voltage of the X-port is continuously maintained at the common voltage VCOM according to the characteristics of the current conveyor, and a mirrored current flowing into the X-port is output through the ZP-port.

The second current conveyor 610 includes an X-port connected to the single-wire 10, a Y-port to which a common voltage VCOM is applied, and a ZP-port commonly connected to the current-voltage converter 620 and the inverter 630. The second current conveyor 610 mirrors a current sensed through the X-port and outputs the mirrored current through the ZP-port. In the present exemplary embodiment, the second current conveyor 610 is activated in response to an enable signal, and is deactivated in response to a disable signal.

The current-voltage converter 620 includes a second resistor. The second resistor has one end connected to the ZP-port of the second current conveyor 610 and the inverter 630 and another end to which a common voltage VCOM is applied. That is, the current-voltage converter 620 performs the role of converting a mirrored current into a voltage.

The inverter 630 has one end commonly connected to the ZP-port of the second current conveyor 610 and the current-voltage converter 620, and another end connected to the output terminal RXB. The inverter 630 inverts a phase of a signal converted into voltage to restore the transmitted voltage signal, and outputs the restored transmitted voltage signal to an external side through the output terminal RXB. In the present exemplary embodiment, reference numeral RXB is used interchangeably as an output terminal and a reception voltage signal.

During operation, a voltage of the input terminal TXA is converted into a current through the voltage-current converter 520 and is input to the X-port of the first current conveyor 530. A current input to the first current conveyor 530 is mirrored by an operation of a current conveyor and is outputted through the ZP-port of the first current conveyor 530. At this time, a phase of the mirrored current is opposite to a phase of the input current, and a magnitude of the mirrored current is the same as a magnitude of the input current.

In a signal measured from the single-wire 10 connected to an output of the ZP-port of the first current conveyor 530 and the X-port of the second current conveyor 610, a current signal is present but a voltage signal is not, depending on the characteristics of the first current conveyor 530 and the second current conveyor 610. Theoretically, a voltage fluctuation in a current conveyor is zero.

When a current signal is input to the X-port of the second current conveyor 610 through the single-wire 10, the input current is mirrored and outputted through the ZP-port of the second current conveyor 610. The output current is converted into a voltage by the current-voltage converter 620. The converted voltage is inverted by the inverter 630 and then output through the output terminal RXB.

According to the above process, since the signal transmitted from the input terminal TXA goes through the single-wire 10 and the current conveyors, an electronic delay occurs between the signal received through the output terminal RXB and the signal transmitted from the input terminal TXA. However, the phase and logic level values of the signal received through the output terminal RXB are the same as the phase and logic level values of the signal transmitted through the input terminal TXA.

In order to improve noise characteristics between transmission lines, a capacitor connected in parallel with the current-voltage converter 620 may be additionally disposed on a receiving side. Meanwhile, in order to improve noise characteristics between transmission lines, the inverter 630 may be implemented as a Schmitt trigger inverter.

Figure 10A:
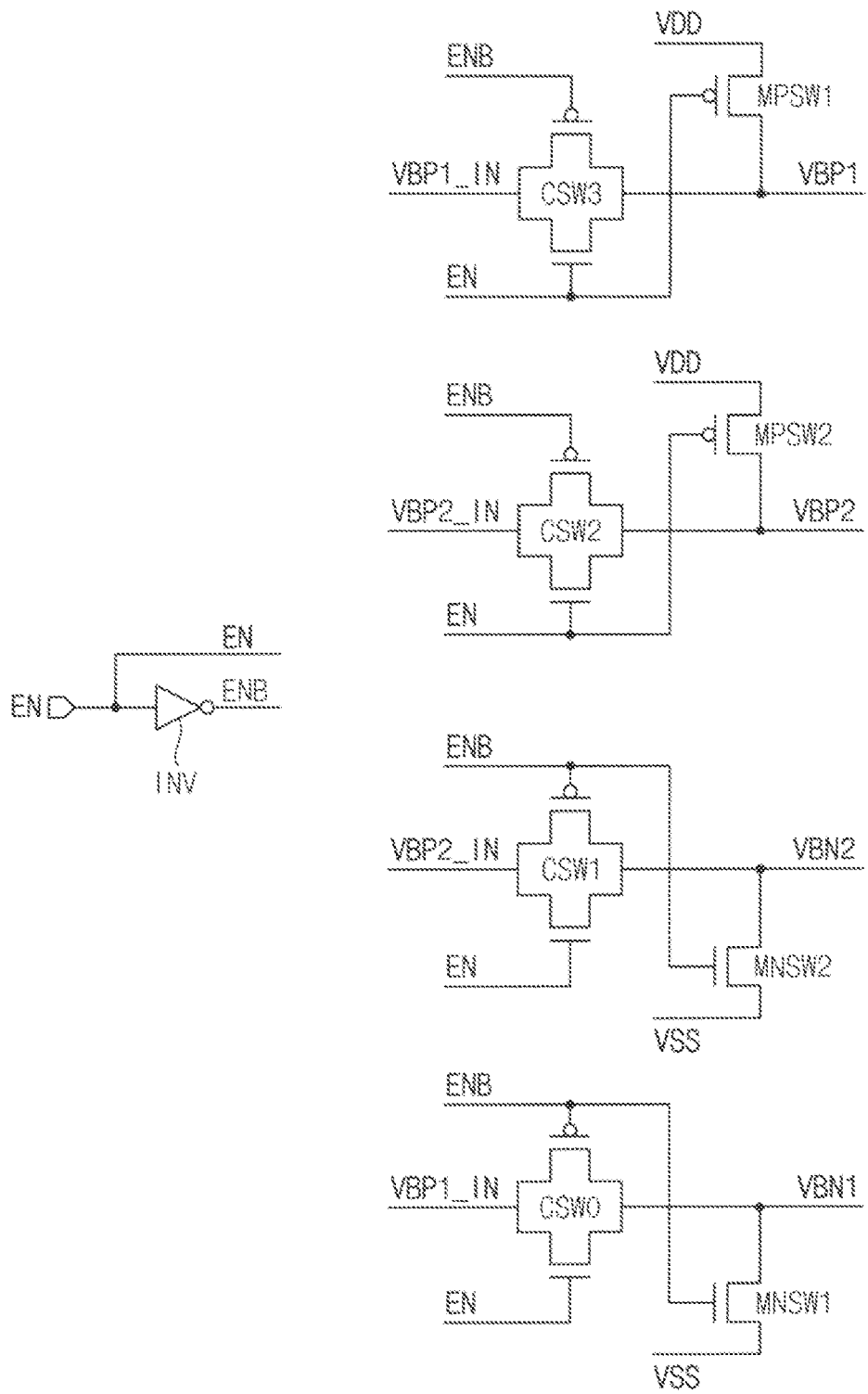
FIG. 10A and FIG. 10B are circuit diagrams explaining an example of the first current conveyor or the second current conveyor shown in FIG. 9A and FIG. 9B.
Figure 10B:
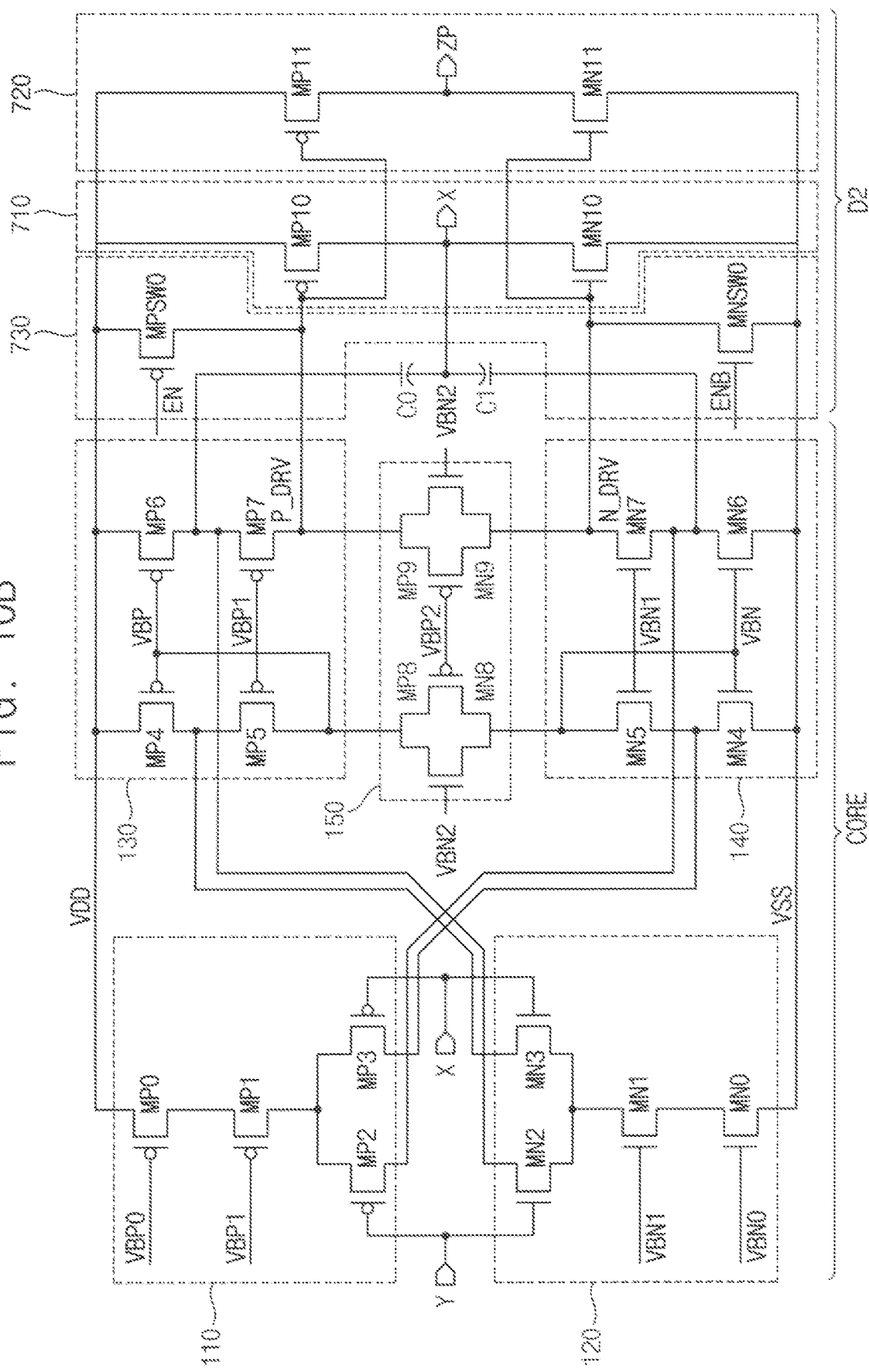

FIG. 10A and FIG. 10B are circuit diagrams explaining an example of the first current conveyor or the second current conveyor shown in FIG. 9A and FIG. 9B.

Referring to FIG. 10A and FIG. 10B, each of the first current conveyor and the second current conveyor according to an example includes a bias switching block BS, a core block CORE, and a driving block D2. In the present embodiment, since the core block CORE has been described with reference to FIG. 6, the same reference numerals will be used to refer to the same or like parts in FIG. 10A and FIG. 10b as those described I FIG. 6, and any further explanation concerning the above elements will be omitted.

The bias switching block BS applies VBP0, VBP1 and VBP2 as bias voltages of the PMOS devices to the core block CORE and the driving block D2 in response to an enable signal EN and a disable signal ENB. In addition, the bias switching block BS shown in FIG. 10B applies VBN0, VBN1 and VBN2 as bias voltages of the NMOS devices to the core block CORE and the driving block D2 in response to the enable signal EN and the disable signal ENB.

The bias switching block BS includes an inverter that inverts the enable signal EN to output the disable signal ENB.

The bias switching block BS further includes a first transmission gate SCW0 and a first N-type switch MNSW1. Here, the first transmission gate SCW0 receives the VBN1_IN signal from the bias circuit block, and outputs VBN1 as a bias voltage to a gate of a transistor MN1, a gate of a transistor MN5, and a gate of a transistor MN7 in response to the enable signal EN and the disable signal ENB. The first N-type switch MNSW1 has a source connected to each of the gate of the transistor MN1, the gate of the transistor MN5 and the gate of the transistor MN7, a gate connected to the disable signal ENB, and a drain connected to a second power voltage VSS.

In operation, the first transmission gate SCW0 and the first N-type switch MNSW1 apply a bias voltage VBN1 to a gate of the transistor MN1, a gate of the transistor MN5 and a gate of the transistor MN7, respectively, in response to the enable signal EN, to turn on each of the transistors MN1, MN5 and MN7. Meanwhile, the first transmission gate SCW0 and the first N-type switch MNSW1 turn off each of the transistors MN1, MN5 and MN7 in response to the disable signal ENB. Accordingly, since transistors connected to the sources of the transistors MN1, MN5 and MN7 are converted into a floating state, it may reduce power consumption of the current conveyor.

The bias switching block BS further includes a second transmission gate SCW1 and a second N-type switch MNSW2. Here, the second transmission gate SCW1 receives the VBN2_IN signal from the bias circuit block, and outputs VBN2 as a bias voltage to a gate of a transistor MN8 and a gate of a transistor MN9 in response to the enable signal EN and the disable signal ENB. The second N-type switch MNSW2 has a source connected to each of the gate of the transistor MN8 and the gate of the transistor MN9, a gate connected to the disable signal ENB, and a drain connected to a second power voltage VSS.

In operation, the second transmission gate SCW1 and the second N-type switch MNSW2 apply a bias voltage VBN2 to the gate of the transistor MN8 and the gate of the transistor MN9, respectively, in response to the enable signal EN, to turn on each of the transistors MN8 and MN9. Meanwhile, the second transmission gate SCW1 and the second N-type switch MNSW2 turn off each of the transistors MN8 and MN9 in response to the disable signal ENB. Accordingly, since transistors connected to the sources of the transistors MN8 and MN9 are converted into a floating state, it may reduce power consumption of the current conveyor.

The bias switching block BS further includes a third transmission gate SCW3 and a first P-type switch MPSW1. Here, the third transmission gate SCW3 receives the VBN1_IN signal from the bias circuit block, and outputs VBP1 as a bias voltage to a gate of a transistor MP1, a gate of a transistor MP5, and a gate of a transistor MP7 in response to the enable signal EN and the disable signal ENB. The first P-type switch MPSW1 has a source connected to each of the gate of the transistor MP1, the gate of the transistor MP5 and the gate of the transistor MP7, a gate connected to the disable signal ENB, and a drain connected to a first power voltage VDD.

In operation, the third transmission gate SCW3 and the first P-type switch MPSW1 apply a bias voltage VBP1 to a gate of the transistor MP1, a gate of the transistor MP5 and a gate of the transistor MP7, respectively, in response to the enable signal EN, to turn on each of the transistors MP1, MP5 and MP7. Meanwhile, the third transmission gate SCW3 and the first P-type switch MPSW1 turn off each of the transistors MP1, MP5 and MP7 in response to the disable signal ENB. Accordingly, since transistors connected to the drains of the transistors MP1, MP5 and MP7 are converted into a floating state, it may reduce power consumption of the current conveyor.

The bias switching block BS further includes a fourth transmission gate SCW2 and a second P-type switch MPSW2. Here, the fourth transmission gate SCW2 receives the VBN2_IN signal from the bias circuit block, and outputs VBP2 as a bias voltage to a gate of a transistor MP1, a gate of a transistor MP5, and a gate of a transistor MP7 in response to the enable signal EN and the disable signal ENB. The second N-type switch MPSW2 has a source connected to each of the gate of the transistor MP8 and the gate of the transistor MP9, a gate connected to the disable signal ENB, and a drain connected to a first power voltage VDD.

In operation, the fourth transmission gate SCW2 and the second P-type switch MPSW2 apply a bias voltage VBP2 to a gate of the transistor MP8 and a gate of the transistor MP9, respectively, in response to the enable signal EN, to turn on each of the transistors MP8 and MP9. Meanwhile, the fourth transmission gate SCW2 and the second P-type switch MPSW2 turn off each of the transistors MP8 and MP9 in response to the disable signal ENB. Accordingly, since transistors connected to the drains of the transistors MP8 and MP9 are converted into a floating state, it may reduce power consumption of the current conveyor.

The driving block D2 includes a first driver 710, a second driver 720, and a switching unit 730, and outputs a normal output current through the ZP-port in response to a first driving voltage P_DRV and a second driving voltage N_DRV.

The first driver 710 includes a transistor MP10 and a transistor MN10 connected in series. The transistor MP10 has a source to which a first power voltage VDD is applied, a gate connected to the upper current mirror terminal 130, and a drain connected to a drain of the transistor MN10 and a X-port. The transistor MN10 has a source to which a second power voltage VSS is applied, a gate connected to the lower current mirror terminal 140, and a drain connected to the drain of the transistor MP10 and the X-port. The first driver 710 performs the role of connect the output to the X-port of the input stage to match the configuration of the second generation current conveyor.

The second driver 720 includes a transistor MP11 and a transistor MN11 connected in series. The transistor MP11 has a source to which the first power voltage VDD is applied, a gate connected to the gate of the transistor MP10, and a drain connected to a drain of the transistor MN11 and a ZP-port. The transistor MN11 has a source to which a second power voltage VSS is applied, a gate connected to the lower current mirror terminal 140 and the gate of the transistor MN10, and a drain connected to a drain of the transistor MP11 and the ZP-port. Unlike the first driver 710 connected to the X-port of the differential input stage of the upper differential input terminal 110 and the lower differential input terminal 120, the second driver 720 is connected to the ZP-port for output driving.

The switching unit 730 includes a transistor MPSW0 and a transistor MNSW0, and controls on/off operation of each of the first driver 710 and the second driver 720. The transistor MPSW0 has a source to which the first power voltage VDD is applied, a gate to which the enable signal EN is applied, and a drain connected to each of the gates of the transistors MP10 and MP11. The transistor MPSW0 is turned on or turned off according to the enable signal EN to turn on/off the operation of the transistors MP10 and MP11. The transistor MNSW0 has a source connected to the gates of the transistors MN10 and MN11, respectively, a gate to which the disable signal ENB is applied, and a drain connected to a second power voltage VSS. The transistor MNSW0 is turned on or turned off according to the disable signal ENB to turn on/off the operations of the transistors MN10 and MN11.

Figure 11:
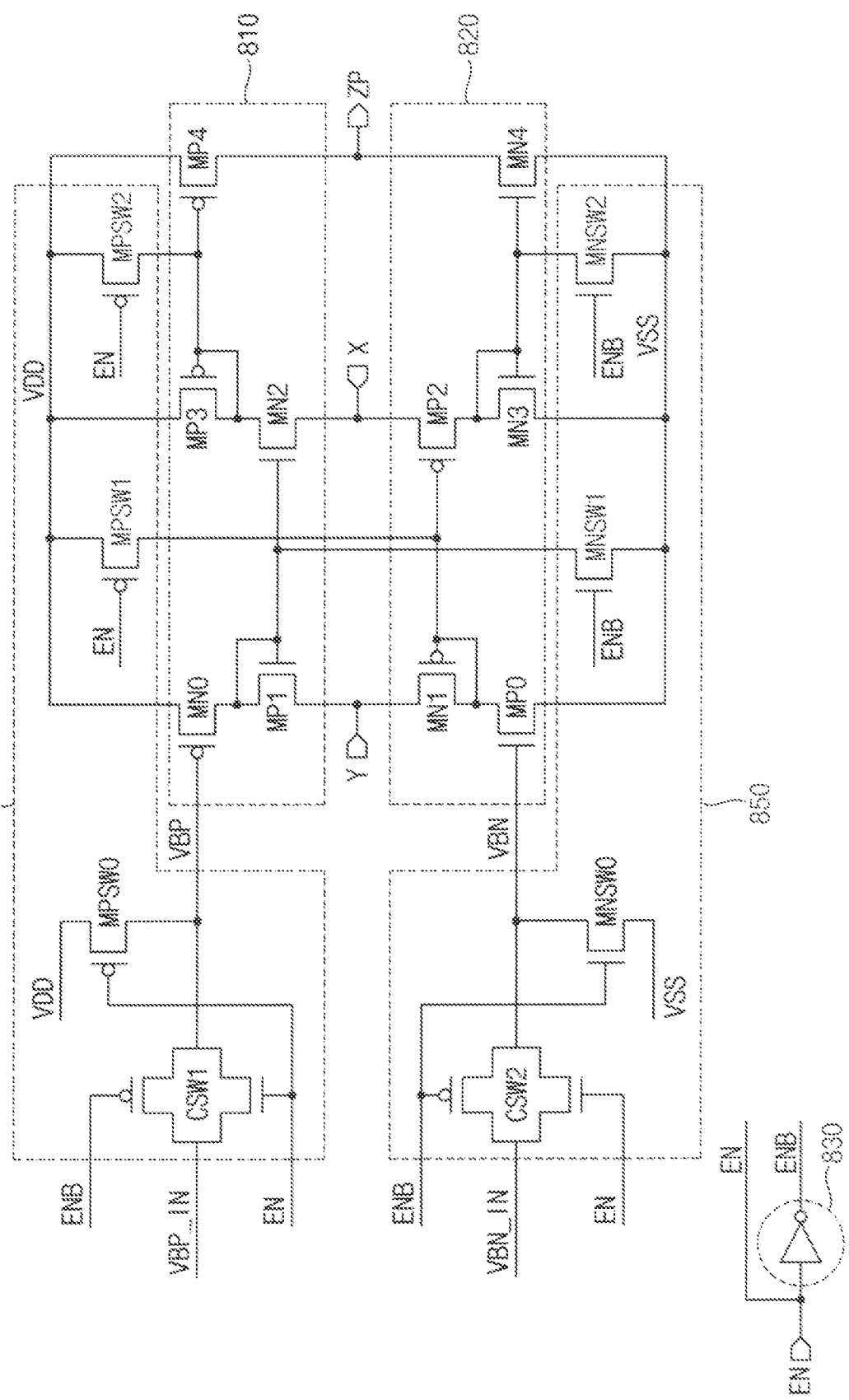
FIG. 11 is a circuit diagram explaining another example of the first current conveyor or the second current conveyor shown in FIG. 9.

FIG. 11 is a circuit diagram explaining another example of the first current conveyor or the second current conveyor shown in FIG. 9A and FIG. 9B.

Referring to FIG. 11, each of the first current conveyor and the second current conveyor according to another example includes an upper current mirror unit 810, a lower current mirror unit 820, an inverting unit 830, an upper switching unit 840 and a lower switching unit 850.

The upper current mirror unit 810 includes a transistor MN0, a transistor MP1, a transistor MN2, a transistor MP3 and a transistor MP4. In the present exemplary embodiment, the transistors MN0, MP1 and MN2 may define a first current mirror, and the transistors MN2, MP3 and MP4 may define a second current mirror.

In particular, the transistor MN0 has a source connected to a first power voltage VDD, a gate connected to the upper switching unit 840, and a drain connected to a source and a gate of the transistor MP1. The transistor MP1 has a source connected to the drain of the transistor MN0, a gate connected to the drain of the transistor MN0 and the gate of the transistor MN2, and a drain connected to the Y-port. Here, the source and gate of the transistor MP1 are commonly connected. The transistor MN2 has a source connected to the drain of the transistor MP3, a gate connected to the gate of the transistor MP1, and a drain connected to the X-port. The transistor MP3 has a source connected to a first power voltage VDD, a gate connected to the gate of the transistor MP4, and a drain connected to the source of the transistor MN2. The gate and drain of the transistor MP3 are commonly connected. The transistor MP4 has a source connected to a first power voltage VDD, a gate connected to the gate and drain of the transistor MP3, and a drain connected to the ZP-port.

The lower current mirror unit 820 includes a transistor MP0, a transistor MN1, a transistor MP2, a transistor MN3 and a transistor MN4. In the present exemplary embodiment, the transistors MP0, MN1 and MP2 may define a third current mirror, and the transistors MP2, MN3 and MN4 may define a fourth current mirror.

In particular, the transistor MP0 has a source connected to the drain of MN1, a gate connected to the lower switching unit 850, and a drain connected to a second power voltage VSS. The transistor MN1 has a source connected to the Y-port, a gate connected to the gate of the transistor MP2, and a drain connected to the source of the transistor MP0. Here, the gate and drain of the transistor MN1 are commonly connected. The transistor MP2 has a source connected to the X-port, a gate connected to the gate of the transistor MN1, and a drain connected to the source and gate of the transistor MN3. The transistor MN3 has a source connected to the drain of the transistor MP2, a gate connected to the gate of the transistor MN4, and a drain connected to a second power voltage VSS. Here, the source and gate of the transistor MN3 are commonly connected. The transistor MN4 has a source connected to the ZP-port, a gate connected to the source and gate of the transistor MN3, and a drain connected to a second power voltage VSS.

The inverting unit 830 receives the enable signal EN and outputs the disable signal ENB to the upper switching unit 840 and the lower switching unit 850, respectively.

The upper switching unit 840 includes a first transmission gate CSW1, a transistor MPSW0, a transistor MPSW1 and a transistor MPSW2, and controls the on/off operations of the upper current mirror unit 810 and the lower current mirror unit 820.

In particular, the first transmission gate CSW1 is turned on/off in response to the enable signal EN and the disable signal ENB to output VBP_IN as a bias voltage to a drain of the transistor MPSW0 and the upper current mirror unit 810.

The transistor MPSW0 has a source connected to a first power voltage VDD, a gate receiving an enable signal EN, and a drain connected to an output terminal of the first transmission gate CSW1 and a gate of the transistor MN0 of the upper current mirror unit 810. The transistor MPSW0 on/off controls an operation of the transistor MN0 in response to the enable signal EN. In the present exemplary embodiment, when an operation of the transistor MN0 is turned off, the transistor MP1 is converted into a floating state, so that power consumption of the current conveyor may be reduced.

The transistor MPSW1 has a source connected to the first power voltage VDD, a gate receiving the enable signal EN, and a drain connected to a gate of the transistor MP2 of the lower current mirror unit 820. The transistor MPSW1 turns on/off an operation of the transistor MP2 in response to the enable signal EN. In the present exemplary embodiment, when an operation of the transistor MP2 is turned off, the transistor MN3 is converted into a floating state, so that power consumption of the current conveyor may be reduced.

The transistor MPSW2 has a source connected to the first power voltage VDD, a gate receiving the enable signal EN, and a drain connected to a gate of the transistor MP4 of the upper current mirror unit 810. The transistor MPSW2 on/off controls an operation of the transistors MP3 and MP4 in response to the enable signal EN. In the present exemplary embodiment, when an operation of the transistors MP3 and MP4 is turned off, the transistor MN2 is converted into a floating state, so that power consumption of the current conveyor may be reduced.

The lower switching unit 850 includes a second transmission gate CSW2, a transistor MNSW0, a transistor MNSW1, and a transistor MPSW2, and controls the on/off operations of the upper current mirror unit 810 and the lower current mirror unit 820.

In particular, the second transmission gate CSW2 is turned on/off in response to the enable signal EN and the disable signal ENB to output VBN_IN as a bias voltage to a drain of the transistor MNSW0 and the lower current mirror unit 820.

The transistor MNSW0 has a source connected to an output terminal of the second transmission gate CSW2 and a gate of the transistor MP0 of the lower current mirror unit 820, a gate receiving the disable signal ENB, and a drain connected to the second power voltage VSS. The transistor MNSW0 turns on/off an operation of the transistor MP0 in response to the disable signal ENB. In the present exemplary embodiment, when an operation of the transistor MP0 is turned off, the transistor MN1 is converted into a floating state, so that power consumption of the current conveyor may be reduced.

The transistor MNSW1 has a source connected to a gate of the transistor MN2 of the upper current mirror unit 810, a gate receiving the disable signal ENB, and a drain connected to the second power voltage VSS. The transistor MNSW1 on/off controls an operations of the transistors MP1 and MN2 in response to the disable signal ENB. In the present exemplary embodiment, when an operation of the transistor MN2 is turned off, the transistor MP3 is converted into a floating state, so that power consumption of the current conveyor may be reduced.

The transistor MNSW2 has a source connected to a gate of the transistor MN4 of the lower current mirror unit 820, a gate receiving the disable signal ENB, and a drain connected to the second power voltage VSS. The transistor MNSW2 on/off controls an operations of the transistors MN3 and MN4 in response to the disable signal ENB. In the present exemplary embodiment, when an operation of the transistors MN3 and MN4 is turned off, the transistor MP2 is converted into a floating state, so that power consumption of the current conveyor may be reduced.

As described above, according to the present embodiment, each of the first communication module and the second communication module is configured to include a single current conveyor, and the first communication module and the second communication module are directly connected through a single-wire to enable unidirectional communication. Accordingly, by reducing the number of pins (or pads) for data transmission between chips to one, the number of pins may be reduced. Moreover, since it may reduce the number of pins, it may improve a price competitiveness of a chip and may reduce power consumption.

Having described exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A single-wire communication system comprising:
a single-wire;
a first communication module comprising a plurality of current conveyors, the first communication module being connected to one side of the single-wire; and
a second communication module comprising a plurality of current conveyors, the second communication module being connected to another side of the single-wire,
wherein when a first transmitted voltage signal is provided from an external device to the first communication module, the first communication module converts the first transmitted voltage signal into a first transmitted current signal and outputs it to the second communication module via the single-wire, and the second communication module converts the first transmitted current signal received via the single-wire into a voltage to restore the first transmitted voltage signal, and
wherein when a second transmitted voltage signal is provided from the outside to the second communication module, the second communication module converts a second transmitted voltage signal into a second transmitted current signal and outputs it to the first communication module through the single-wire, and the first communication module converts the second transmitted current signal received via the single-wire into a voltage to restore the second transmitted voltage signal.

2. The single-wire communication system of claim 1, wherein each of the first communication module and the second communication module is configured in plurality to transmit and receive signals of in-phase or signals of in-phase and in-phase, respectively.

3. The single-wire communication system of claim 1, wherein a plurality of the first communication modules are arranged in parallel, and a plurality of the second communication modules are arranged in parallel, wherein each of the first communication modules and the second communication modules performs signal transmission through one end and signal reception through the other end at the same time.

4. The single-wire communication system of claim 1, wherein the first communication module comprises:
   a first buffer connected to a first input terminal for receiving a first transmitted voltage signal to buffer the first transmitted voltage signal;
   a first voltage-current converter having one end connected to the first buffer and another end connected to one end of the single-wire;
   a first current conveyor comprising an X-port connected to another end of the first voltage-current converter, a Y-port to which a common voltage is applied, and a ZP-port, the first current conveyor mirroring a current sensed at the X-port to output the mirrored current through the ZP-port;
   a first inverter having one end connected to the first input terminal;
   a second voltage-current converter having one end connected to another end of the first inverter;
   a second current conveyor comprising an X-port connected to another end of the second voltage-current converter, a Y-port to which a common voltage is applied, and a ZP-port connected to the ZP-port of the first current conveyor;
   a third current conveyor comprising an X port respectively connected to the ZP-port of the first current conveyor and the ZP-port of the second current conveyor, the third current conveyor mirroring a difference between the currents of the first current conveyor and the second current conveyor to output the mirrored current through a ZP-port;
   a first current-voltage conversion amplifier converting the current output through the ZP-port of the third current conveyor into a voltage and amplifying the voltage; and
   a second inverter being connected to an output terminal of the first current-voltage conversion amplifier and a first output terminal.

5. The single-wire communication system of claim 1, wherein the second communication module comprises:
   a second buffer being connected to a second input terminal for receiving a second transmitted voltage signal and buffering the second transmitted voltage signal;
   a third voltage-current converter having one end connected to the second buffer and another end connected to one end of the single-wire;
   a fourth current conveyor comprising an X-port connected to another end of the third voltage-current converter, a Y-port to which a common voltage is applied, and a ZP-port, the fourth current conveyor mirroring a current sensed at the X-port to output the mirrored current through the ZP-port;
   a third inverter having one end connected to the second input terminal;
   a fourth voltage-current converter having one end connected to another end of the third inverter;
   a fifth current conveyor comprising an X-port connected to another end of the fourth voltage-current converter, a Y-port to which a common voltage is applied, and a ZP-port connected to the ZP-port of the fourth current conveyor;
   a sixth current conveyor comprising an X port respectively connected to the ZP-port of the fourth current conveyor and the ZP-port of the fifth current conveyor, the sixth current conveyor mirroring a difference between the currents of the fourth current conveyor and the fifth current conveyor to output the mirrored current through a ZP-port;
   a second current-voltage conversion amplifier converting the current output through the ZP-port of the sixth current conveyor into a voltage and amplifying the voltage; and
   a fourth inverter connected to an output terminal of the second current-voltage conversion amplifier and a second output terminal.

6. The single-wire communication system of claim 1, wherein the first communication module comprises:
   a first buffer connected to a first input terminal for receiving a first transmitted voltage signal to buffer the first transmitted voltage signal;
   a first voltage-current converter having one end connected to the first buffer and another end connected to one end of the single-wire;
   a first current conveyor comprising an X-port connected to another end of the first voltage-current converter, a Y-port to which a common voltage is applied, and a ZP-port, the first current conveyor mirroring a current sensed at the X-port to output the mirrored current through the ZP-port;
   a first inverter having one end connected to the first input terminal;
   a second voltage-current converter having one end connected to another end of the first inverter;
   a second current conveyor comprising an X-port connected to another end of the second voltage-current converter, a Y-port to which a common voltage is applied, and a ZP-port connected to the ZP-port of the first current conveyor;
   a first current-voltage conversion amplifier being respectively connected to the ZP-port of the first current conveyor and the ZP-port of the second current conveyor, the first current-voltage conversion amplifier mirroring a difference between the currents of the first current conveyor and the second current conveyor to amplify the mirrored current; and
   a second inverter being connected to an output terminal of the first current-voltage conversion amplifier and a first output terminal.

7. The single-wire communication system of claim 6, wherein the second communication module comprises:
   a second buffer being connected to a second input terminal for receiving a second transmitted voltage signal and buffering the second transmitted voltage signal;
   a third voltage-current converter having one end connected to the second buffer and another end connected to one end of the single-wire;
   a fourth current conveyor comprising an X-port connected to another end of the third voltage-current converter, a Y-port to which a common voltage is applied, and a ZP-port, the fourth current conveyor mirroring a current sensed at the X-port to output the mirrored current through the ZP-port;
   a third inverter having one end connected to the second input terminal;
   a fourth voltage-current converter having one end connected to another end of the third inverter;
   a fifth current conveyor comprising an X-port connected to another end of the fourth voltage-current converter, a Y-port to which a common voltage is applied, and a ZP-port connected to the ZP-port of the fourth current conveyor;

a second current-voltage conversion amplifier respectively connected to the ZP-port of the fourth current conveyor and the ZP-port of the fifth current conveyor, the second current-voltage conversion amplifier converting a difference between the currents of the fourth current conveyor and the fifth current conveyor into a voltage and amplifying the voltage; and a fourth inverter connected to an output terminal of the second current-voltage conversion amplifier and a second output terminal.

8. The single-wire communication system of claim 1, wherein the first communication module comprises:

a first buffer connected to a first input terminal for receiving a first transmitted voltage signal to buffer the first transmitted voltage signal;

a first voltage-current converter having one end connected to the first buffer and another end connected to one end of the single-wire;

a first current conveyor comprising an X-port connected to another end of the first voltage-current converter, a Y-port to which a common voltage is applied, and a ZP-port, the first current conveyor mirroring a current sensed at the X-port to output the mirrored current through the ZP-port;

a first inverter having one end connected to the first input terminal;

a second voltage-current converter having one end connected to another end of the first inverter;

a second current conveyor comprising an X-port connected to another end of the second voltage-current converter, a Y-port to which a common voltage is applied, and a ZP-port connected to the ZP-port of the first current conveyor;

a third current conveyor comprising an X port respectively connected to the ZP-port of the first current conveyor and the ZP-port of the second current conveyor, the third current conveyor mirroring a difference between the currents of the first current conveyor and the second current conveyor to output the mirrored current through a ZP-port;

a first current-voltage conversion resistor receiving a current output through the ZP port of the third current conveyor through one end and converting the current into a voltage; and a second inverter being connected to another end of the first current-voltage conversion resistor and a first output terminal.

9. The single-wire communication system of claim 8, wherein the second communication module comprises:

a second buffer being connected to a second input terminal for receiving a second transmitted voltage signal and buffering the second transmitted voltage signal;

a third voltage-current converter having one end connected to the second buffer and another end connected to one end of the single-wire;

a fourth current conveyor comprising an X-port connected to another end of the third voltage-current converter, a Y-port to which a common voltage is applied, and a ZP-port, the fourth current conveyor mirroring a current sensed at the X-port to output the mirrored current through the ZP-port;

a third inverter having one end connected to the second input terminal;

a fourth voltage-current converter having one end connected to another end of the third inverter;

a fifth current conveyor comprising an X-port connected to another end of the fourth voltage-current converter, a Y-port to which a common voltage is applied, and a ZP-port connected to the ZP-port of the fourth current conveyor;

a sixth current conveyor comprising an X port respectively connected to the ZP-port of the fourth current conveyor and the ZP-port of the fifth current conveyor, the sixth current conveyor mirroring a difference between the currents of the fourth current conveyor and the fifth current conveyor to output the mirrored current through a ZP-port;

a second current-voltage conversion resistor receiving a current output through the ZP-port of the sixth current conveyor through one end and converting the current into a voltage; and a fourth inverter connected to another end of the second current-voltage conversion resistor and a second output terminal.

* * * * *